(12) United States Patent
Choi

(10) Patent No.: US 11,887,669 B2
(45) Date of Patent: Jan. 30, 2024

(54) APPARATUS AND METHOD FOR PROGRAMMING DATA IN A NON-VOLATILE MEMORY DEVICE

(71) Applicant: SK hynix Inc., Gyeonggi-do (KR)

(72) Inventor: Hyung Jin Choi, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 192 days.

(21) Appl. No.: 17/669,972

(22) Filed: Feb. 11, 2022

(65) Prior Publication Data
US 2023/0077184 A1 Mar. 9, 2023

(30) Foreign Application Priority Data
Sep. 7, 2021 (KR) .................. 10-2021-0119093

(51) Int. Cl.
*G11C 16/10* (2006.01)
*G11C 16/24* (2006.01)
*G11C 16/34* (2006.01)
*G11C 16/04* (2006.01)

(52) U.S. Cl.
CPC .......... *G11C 16/10* (2013.01); *G11C 16/0483* (2013.01); *G11C 16/24* (2013.01); *G11C 16/3459* (2013.01)

(58) Field of Classification Search
CPC ..... G11C 16/10; G11C 16/0483; G11C 16/24; G11C 16/3459; G11C 16/32; G11C 11/5628
See application file for complete search history.

(56) References Cited

U.S. PATENT DOCUMENTS

| 8,804,422 B2 * | 8/2014 | Chung ............... G11C 16/3459 |
| | | 365/185.24 |
| 2020/0051649 A1 * | 2/2020 | Her ..................... G11C 16/30 |

FOREIGN PATENT DOCUMENTS

KR  10-2015-0110917 A  10/2015
KR  10-1942863 B1  1/2019

* cited by examiner

*Primary Examiner* — Xiaochun L Chen
(74) *Attorney, Agent, or Firm* — IP & T GROUP LLP

(57) ABSTRACT

A memory device includes a cell group and a control circuit. The cell group includes plural non-volatile memory cells capable of storing data. The control circuit performs a program operation for programming data in the plural non-volatile memory cells through a plurality of program loops, each program loop including a unit program operation for applying a program pulse to the plural non-volatile memory cells and a verification operation for verifying a result of the unit program operation. The control circuit uses a current detection circuit for detecting whether a threshold voltage distribution of the plural non-volatile memory cells satisfies a reference in a specific program loop of the plurality of program loops. The control circuit terminates the program operation after applying a preset program pulse to the plural non-volatile memory cells in a next program loop following the specific program loop.

20 Claims, 13 Drawing Sheets

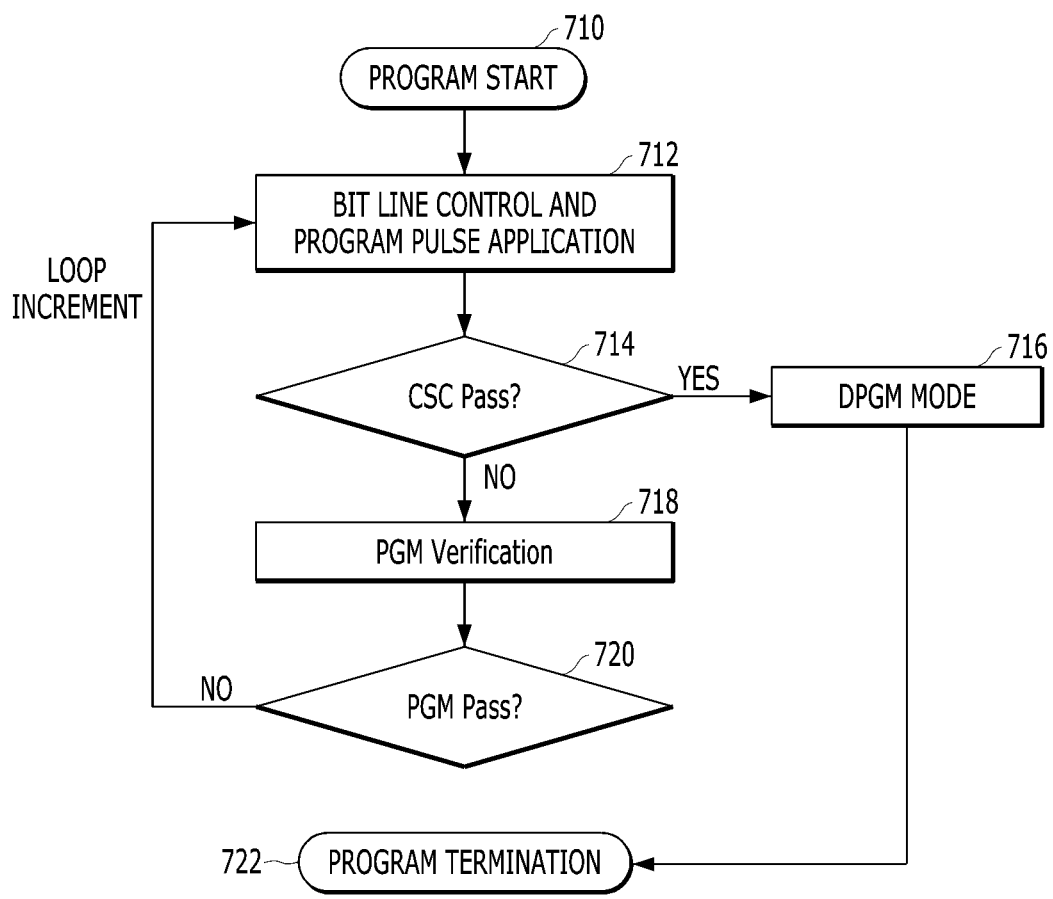

APPARATUS AND METHOD FOR PROGRAMMING DATA IN A NON-VOLATILE MEMORY DEVICE

CROSS-REFERENCE TO RELATED APPLICATIONS

This patent application claims the benefit of Korean Patent Application No. 10-2021-0119093, filed on Sep. 7, 2021, the entire disclosure of which is incorporated herein by reference.

TECHNICAL FIELD

One or more embodiments of the present disclosure described herein relate to a memory device, and more particularly, to an apparatus and method for programming data in a non-volatile memory device.

BACKGROUND

A data processing system includes a memory system or a data storage device. The data processing system can be developed to store more voluminous data in the data storage device, store data in the data storage device faster, and read data stored in the data storage device faster. The memory system or the data storage device can include non-volatile memory cells and/or volatile memory cells for storing data.

BRIEF DESCRIPTION OF THE DRAWINGS

The description herein makes reference to the accompanying drawings wherein like reference numerals refer to like parts throughout the figures.

FIG. 13 illustrates a method of operating a memory device according to an embodiment of the present disclosure.

DETAILED DESCRIPTION

Figure 1:
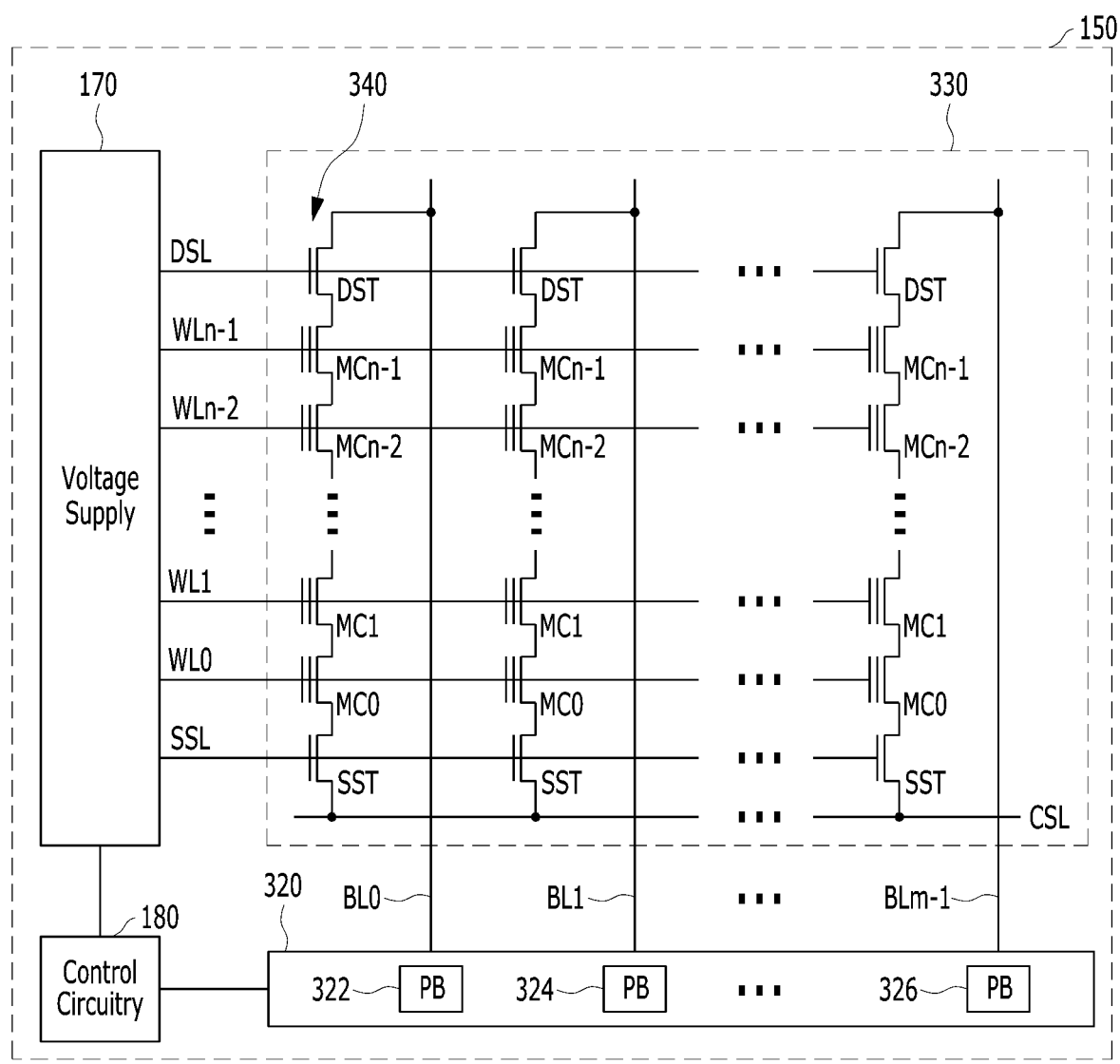
FIG. 1 illustrates a memory device according to an embodiment of the present disclosure.

Various embodiments of the present disclosure are described below with reference to the accompanying drawings. Elements and features of this disclosure, however, may be configured or arranged differently to form other embodiments, which may be variations of any of the disclosed embodiments.

In this disclosure, references to various features (e.g., elements, structures, modules, components, steps, operations, characteristics, etc.) included in "one embodiment," "example embodiment," "an embodiment," "another embodiment," "some embodiments," "various embodiments," "other embodiments," "alternative embodiment," and the like are intended to mean that any such features are included in one or more embodiments of the present disclosure, but may or may not necessarily be combined in the same embodiments.

In this disclosure, the terms "comprise," "comprising," "include," and "including" are open-ended. As used in the appended claims, these terms specify the presence of the stated elements and do not preclude the presence or addition of one or more other elements. The terms in a claim do not foreclose the apparatus from including additional components (e.g., an interface unit, circuitry, etc.).

In this disclosure, various units, circuits, or other components may be described or claimed as "configured to" perform a task or tasks. In such contexts, "configured to" is used to connote structure by indicating that the blocks/units/circuits/components include structure (e.g., circuitry) that performs one or more tasks during operation. As such, the block/unit/circuit/component can be said to be configured to perform the task even when the specified block/unit/circuit/component is not currently operational (e.g., is not turned on nor activated). The block/unit/circuit/component used with the "configured to" language include hardware, for example, circuits, memory storing program instructions executable to implement the operation, etc. Additionally, "configured to" can include a generic structure (e.g., generic circuitry) that is manipulated by software and/or firmware (e.g., an FPGA or a general-purpose processor executing software) to operate in a manner that is capable of performing the task(s) at issue. "Configured to" may also include adapting a manufacturing process (e.g., a semiconductor fabrication facility) to fabricate devices (e.g., integrated circuits) that are adapted to implement or perform one or more tasks.

As used in this disclosure, the term 'circuitry' or 'logic' refers to all of the following: (a) hardware-only circuit implementations (such as implementations in only analog and/or digital circuitry) and (b) combinations of circuits and software (and/or firmware), such as (as applicable): (i) to a combination of processor(s) or (ii) to portions of processor(s)/software (including digital signal processor(s)), software, and memory(ies) that work together to cause an apparatus, such as a mobile phone or server, to perform various functions) and (c) circuits, such as a microprocessor(s) or a portion of a microprocessor(s), that require software or firmware for operation, even if the software or firmware is not physically present. This definition of 'circuitry' or 'logic' applies to all uses of this term in this application, including in any claims. As a further example, as used in this application, the term "circuitry" or "logic" also covers an implementation of merely a processor (or multiple processors) or portion of a processor and its (or their) accompanying software and/or firmware. The term "circuitry" or "logic" also covers, for example, and if applicable to a particular claim element, an integrated circuit for a storage device.

As used herein, these terms "first," "second," "third," and so on are used as labels for nouns that they precede, and do not imply any type of ordering (e.g., spatial, temporal, logical, etc.). The terms "first" and "second" do not necessarily imply that the first value must be written before the second value. Further, although the terms may be used herein to identify various elements, these elements are not limited by these terms. These terms are used to distinguish one element from another element that otherwise have the same or similar names. For example, a first circuitry may be distinguished from a second circuitry.

Further, the term "based on" is used to describe one or more factors that affect a determination. This term does not foreclose additional factors that may affect a determination. That is, a determination may be solely based on those factors or based, at least in part, on those factors. Consider the phrase "determine A based on B." While in this case, B is a factor that affects the determination of A, such a phrase does not foreclose the determination of A from also being based on C. In other instances, A may be determined based solely on B.

Herein, an item of data, a data item, a data entry or an entry of data may be a sequence of bits. For example, the data item may include the contents of a file, a portion of the file, a page in memory, an object in an object-oriented program, a digital message, a digital scanned image, a part of a video or audio signal, metadata or any other entity which can be represented by a sequence of bits. According to an embodiment, the data item may include a discrete object. According to another embodiment, the data item may include a unit of information within a transmission packet between two different components.

Embodiments of the present disclosure described herein provide a data processing system and a method for operating the data processing system. The data processing system includes components and resources such as a memory system and a host, and is capable of dynamically allocating plural data paths used for data communication between the components based on usages of the components and the resources.

An embodiment of the present disclosure may provide an apparatus and method capable of improving a data input/output speed of a memory device.

Embodiments of the present disclosure can reduce the number of verification operation and/or a time spent on the verification operations by checking a threshold voltage distribution of non-volatile memory cells using a current sensing circuit (CSC) during a procedure of programming data in the memory device.

In a memory device according to an embodiment of the present disclosure, it is possible to reduce operational burden for verification operations, thereby reducing wear-out of non-volatile memory cells included in the memory device as well as interference between neighboring or adjacent non-volatile memory cells. Thus, data safety of the memory device can be improved or enhanced.

Further, in the memory device according to an embodiment of the present disclosure, even though operational burden caused by verification operations regarding a plurality of non-volatile memory cells for each memory cell storing multi-bit data is reduced, a width of a threshold voltage distribution of non-volatile memory cells could be narrowed.

In an embodiment, a memory device can include a cell group including plural non-volatile memory cells capable of storing data; and a control circuit configured to perform a program operation for programming data in the plural non-volatile memory cells through a plurality of program loops, each program loop including a unit program operation for applying a program pulse to the plural non-volatile memory cells and a verification operation for verifying a result of the unit program operation, use a current detection circuit for detecting whether a threshold voltage distribution of the plural non-volatile memory cells satisfies a reference in a specific program loop of the plurality of program loops, and terminate the program operation after applying a preset program pulse to the plural non-volatile memory cells in a next program loop following the specific program loop.

The control circuit can be configured to perform a check operation for recognizing the threshold voltage distribution at a time between the unit program operation and the verification operation in some of the plurality of program loops.

The check operation can include establishing a comparison voltage which has a lower level than a preset level corresponding to a program value which is a target of the program operation, counting a number of non-volatile memory cells having a threshold voltage having a lower level than the comparison voltage, and comparing a counted number with the reference.

The comparison voltage can have a level which is within either a first range between the preset level and a level corresponding to another program value which is the closest lower than the preset level or a second range between the preset level and a level obtained by subtracting a degree of threshold voltage, which is changed through a second program mode, from the preset level.

The verification operation can check the threshold voltage distribution of the plural non-volatile memory cells regarding plural program values corresponding to the program operation.

The unit program operation can be performed in a mode selected among a first mode, a second mode, and a third mode, the first mode to apply the second program pulse to change or adjust a threshold voltage of the at least one non-volatile memory cell by a first level which is equal to, or larger than, a changed level of the threshold voltage, which is caused by the first program pulse; the second mode to apply the second program pulse to change or adjust the threshold voltage of the at least one non-volatile memory cell by a second level which is smaller than the changed level caused by the first program pulse; and the third mode to apply the second program pulse to the at least one non-volatile memory cell of which a change of the threshold voltage is inhibited.

The control circuit can be configured to change values stored in latches, included in page buffers coupled to bit lines coupled to the plural non-volatile memory cells, in response to the mode selected among the first mode, the second mode, and the third mode.

The control circuit can store a value of '0' in a first latch for the unit program operation performed in the first mode, store the value of '0' in a second latch and changes the value of '0' into a value of '1' in the second latch at a timing of turning a transistor coupling the bit line and the page buffer on halfway for the unit program operation performed in the second mode, and store the value of '1' in a third latch for the unit program operation performed in the third mode.

The control circuit can skip the verification operation of the specific program loop when the threshold voltage distribution satisfies the reference and performs the next program loop with either a second mode or a third mode.

The control circuit can apply verification voltages to the plural non-volatile memory cells to check whether the data is programmed in the plural non-volatile memory cells, the verification voltages corresponding to plural program values which are targets of the program operation.

The control circuit can determine a first mode, a second mode, or a third mode performed in the next program loop in response to a result of the verification operation.

In another embodiment, a memory system can include a memory device configured to perform a program operation for programming data in plural non-volatile memory cells through a plurality of program loops, each program loop including a unit program operation for applying a program pulse to the plural non-volatile memory cells and a verification operation for verifying a result of the unit program operation, use a current detection circuit for detecting whether a threshold voltage distribution of the plural non-volatile memory cells satisfies a reference in a specific program loop of the plurality of program loops, and terminate the program operation after applying a preset program pulse to the plural non-volatile memory cells in a next program loop following the specific program loop; and a controller configured to transmit a program command and an address indicating the plural non-volatile memory cells to the memory device.

The memory device can include at least one memory die or at least one memory plane.

The memory device can be configured to perform a check operation for recognizing the threshold voltage distribution at a time between the unit program operation and the verification operation in some of the plurality of program loops.

The check operation can include establishing a comparison voltage which has a lower level than a preset level corresponding to a program value which is a target of the program operation, counting a number of non-volatile memory cells having a threshold voltage having a lower level than the comparison voltage, and comparing a counted number with the reference.

The unit program operation can be performed in a mode selected among a first mode, a second mode, and a third mode, the first mode to apply the second program pulse to change or adjust a threshold voltage of the at least one non-volatile memory cell by a first level which is equal to, or larger than, a changed level of the threshold voltage, which is caused by the first program pulse; the second mode to apply the second program pulse to change or adjust the threshold voltage of the at least one non-volatile memory cell by a second level which is smaller than the changed level caused by the first program pulse; and the third mode to apply the second program pulse to the at least one non-volatile memory cell of which a change of the threshold voltage is inhibited.

The memory device can skip the verification operation of the specific program loop when the threshold voltage distribution satisfies the reference and performs the next program loop with either a second mode or a third mode.

The memory device can determine a first mode, a second mode, or a third mode performed in the next program loop in response to a result of the verification operation.

In another embodiment, a method for operating a memory system can include receiving a program command, program data, and location information in which data is to be stored; controlling bit lines coupled to a plurality of non-volatile memory cells corresponding to the location information in response to the program data and applying a program pulse to a word line coupled to the plurality of non-volatile memory cells; checking, through a current sensing circuit, whether a threshold voltage distribution of the plurality of non-volatile memory cells satisfies a reference; and, when the threshold voltage distribution satisfies the reference, skipping a verification operation on the plurality of non-volatile memory cells and performing a second program mode on some of the plurality of non-volatile memory cells.

The method can further include performing a verification operation on the plurality of non-volatile memory cells when the threshold voltage distribution does not satisfy the reference; and determining one of a first program mode, the second program mode, and a third program mode to be performed on the plurality of non-volatile memory cells according to a result of the verification operation.

In another embodiment, a memory device can include memory cells coupled to a word line; and a control circuit configured to perform program loops each including a program pulse operation of applying a program pulse to the word line. Each of the program loops except a last program loop further includes a check operation of applying a check voltage to the word line to identify a number of on-cells according to the check voltage. Each of the program loops selectively further includes a verification operation of verifying the program pulse operation when the number is greater than a reference. The control circuit performs, when the number is less than the reference, the last program loop to cause programming the memory cells in a double verify program (DPGM) mode.

Embodiments will now be described with reference to the accompanying drawings, wherein like numbers reference like elements.

FIG. 1 illustrates a memory device 150 that includes a memory cell array circuit formed in a memory die according to an embodiment of the present disclosure.

Referring to FIG. 1, the memory device 150 may include at least one memory group 330 having a plurality of cell strings 340. Each cell string 340 may include a plurality of non-volatile memory cells MC0 to MCn−1 connected to a respective bit line of a plurality of bit lines BL0 to BLm−1. The cell strings 340 are disposed in respective columns of the memory group 330, and each cell string 340 can include at least one drain select transistor DST and at least one source select transistor SST. The non-volatile memory cells MC0 to MCn−1 of each cell strong 340 may be connected in series between a drain select transistor DST and a source select transistor SST. Each of the non-volatile memory cells MC0 to MCn−1 may be configured as a multi-level cell (MLC) that stores a data item having plural bits per cell. The cell strings 340 may be electrically connected to corresponding bit lines of the bit lines BL0 to BLm−1.

In an embodiment, the memory group 330 may include NAND-type flash memory cells MC0 to MCn−1. In another embodiment, the memory group 330 can be implemented as a NOR-type flash memory, a hybrid flash memory in which at least two different types of memory cells are mixed or combined, or a one-chip NAND flash memory in which a controller is embedded in a single memory chip. In an embodiment, the memory group 330 can include a flash memory cell including a charge trap flash (CTF) layer that includes a conductive floating gate or insulating layer.

Figure 2:
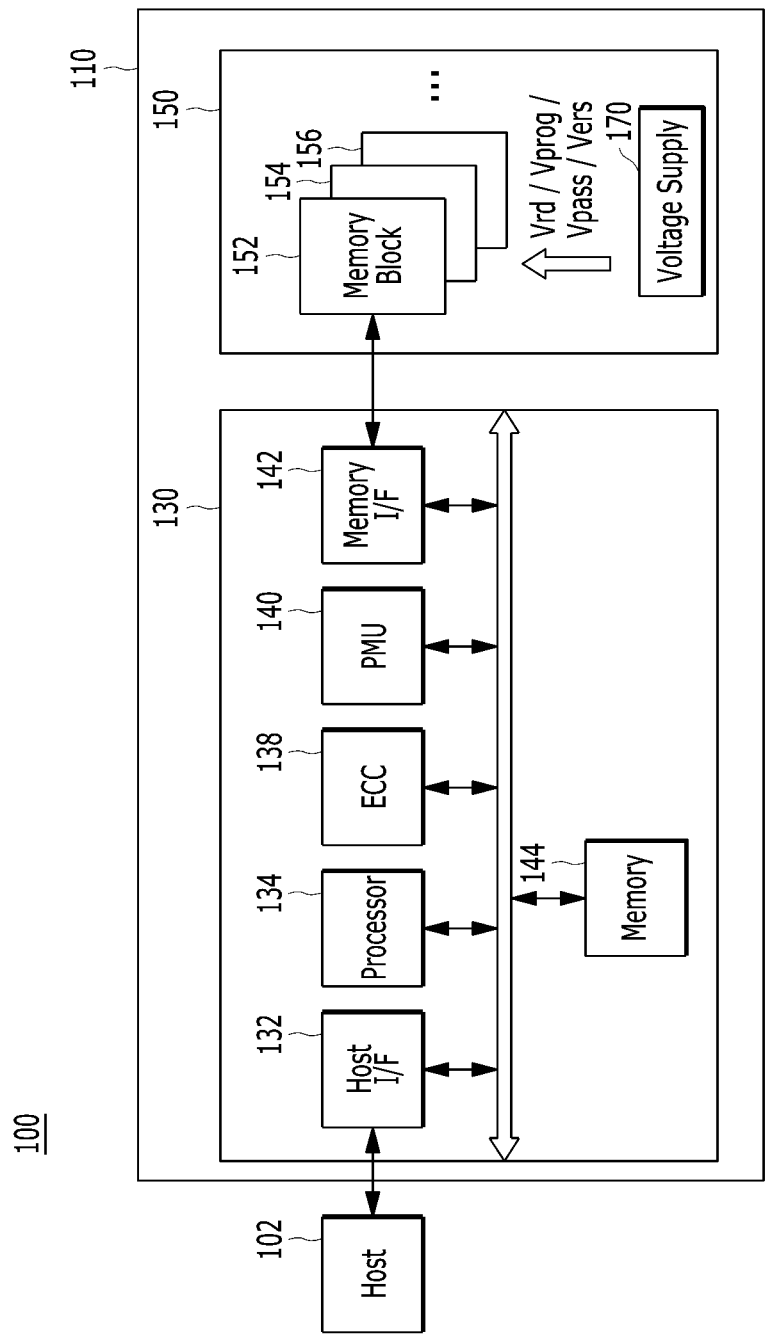
FIG. 2 illustrates a data processing system according to an embodiment of the present disclosure.

FIG. 2 illustrates a memory system 110 which may include the memory device 150 according to an embodiment of the present disclosure. In this embodiment, the memory group 330 in memory device 150 may include one or more memory blocks 152, 154, 156. According to an embodiment, the memory device 150 can have a two-dimensional (2D) or three-dimensional (3D) structure. For example, each of the memory blocks 152, 154, 156 in the memory device 150 may be implemented as a 3D structure for example, a vertical structure. Each of the memory blocks 152, 154, 156 may have a three-dimensional structure extending along first to third directions, for example, an x-axis direction, a y-axis direction, and a z-axis direction.

The memory group 330 including the plurality of memory blocks 152, 154, 156 can be coupled to a plurality of bit lines BL, a plurality of string select lines SSL, and a plurality of drain select lines DSL, a plurality of word lines WL, a plurality of dummy word lines DWL, and a plurality of common source lines CSL. In an embodiment, the memory group 330 can include a plurality of NAND strings NS which, for example, may respectively correspond to cell strings 340. Each NAND string NS may include a plurality of memory cells MC and may be connected to a respective bit line of the bit lines BL. In addition, the string select transistor SST of each NAND string NS may be connected to a common source line CSL, and the drain select transistor DST of each NAND string NS can be connected to a corresponding bit line BL. In each NAND string NS, the memory cells MC may be arranged between the string select transistor SST and the drain select transistor DST.

Referring to FIGS. 1 and 2, the memory device 150 may include a voltage supply circuit 170 which can supply a word line voltage, e.g., one or more predetermined voltages such as a program voltage, a read voltage, and a pass voltage, for respective word lines of the word lines according to an operation mode, or may supply a voltage to a bulk, e.g., a well region, in which each memory block including the memory cells MC are formed. In this case, a voltage generating operation of the voltage supply circuit 170 may be performed under a control of a control circuitry 180. Also, the voltage supply circuit 170 may generate a plurality of variable read voltages to distinguish a plurality of data items from each other.

In response to the control of the control circuit, one of the memory blocks (or sectors) of the memory cell array may be selected, and one of the word lines of the selected memory block may be selected. Word line voltages may be supplied to the selected word line and the unselected word line, individually. The voltage supply circuit 170 may include a voltage generation circuit (e.g., refer to FIGS. 4 to 8) for generating target voltages having various levels.

In an embodiment, the voltage supply circuit 170 may be coupled to a first pin or pad receiving a first power voltage VCC applied from the outside, e.g., an external device, and a second pin or pad receiving the second power voltage VPP applied from the external device. The second power voltage VPP may have a greater voltage level than, e.g., twice or more higher, that of the first power voltage VCC. For example, the first power voltage VCC may have a voltage level of 2.0V to 5.5V, while the second power supply voltage may have a voltage level of 9V to 13V.

According to an embodiment, the voltage supply circuit 170 can include a voltage generation circuit for more rapidly generating the target voltages of various levels used in the memory group 330. The voltage generation circuit can use the second power supply voltage VPP to generate a target voltage, which may have a higher voltage level than the second power voltage VPP.

The memory device 150 may also include a read/write circuit 320 controlled by the control circuitry 180. The read/write circuit 320 may operate as a sense amplifier or a write driver according to an operation mode. For example, in a verification operation and a read operation, the read/write circuit 320 may operate as a sense amplifier for reading the data item from the memory cell array. In a program operation, the read/write circuit 320 may operate as a write driver that controls potentials of bit lines according to a data item to be stored in the memory cell array. The read/write circuit 320 may receive the data item to be programmed to the cell array from page buffers during the program operation. The read/write circuit 320 can drive bit lines based on the input data item. To this end, the read/write circuit 320 may include a plurality of page buffers (PB) 322, 324, 326, with each page buffer corresponding to each column or each bit line, or each column pair or each bit line pair. According to an embodiment, a plurality of latches may be included in each of the page buffers 322, 324, 326.

The page buffers 322, 324, 326 may be coupled to a data input/output device, e.g., a serialization circuit or a serializer, through a plurality of buses BUS. When each of the page buffers 322, 324, 326 is coupled to the data input/output device through different buses, a delay that may occur in data transmission from the page buffers 322, 324, 326 can be reduced. For example, each page buffer 322, 324, 326 can perform the data transmission without a waiting time.

According to an embodiment, the memory device 150 may receive a write command, write data, and information, e.g., a physical address, regarding a location in which the write data is to be stored. The control circuitry 180 causes the voltage supply circuit 170 to generate a program pulse, a pass voltage, etc., used for a program operation performed in response to a write command, and to generate one or more voltages used for a verification operation performed after the program operation.

When a multi-bit data item is programmed in non-volatile memory cells included in the memory group 330, the error rate might be higher than that when a single-bit data item is stored in the non-volatile memory cells. For example, an error in the non-volatile memory cells may be induced due to cell-to-cell interference (CCI). In order to reduce errors in the non-volatile memory cells, a width (deviation) of a threshold voltage distribution corresponding to stored data items between the non-volatile memory cells, should be reduced.

To this end, the memory device 150 can perform an incremental step pulse programming (ISPP) operation to effectively make a narrow threshold voltage distribution of the non-volatile memory cells. In one embodiment, the memory device 150 can use the ISPP operation for multi-step program operations. For example, the memory device 150 may divide a program operation into a Least Significant Bit (LSB) program operation and a Most Significant Bit (MSB) operation according to a predetermined order between the non-volatile memory cells or pages.

According to an embodiment, it is possible to provide an apparatus and method which is capable of reducing a time for discharging a bit line or a channel between program pulse applications during a data programming operation accomplished by applying a plurality of program pulses to memory cells in a memory device. When a discharge time could be reduced, the speed of the program operation of the memory device may be increased. For example, in order to discharge a bit line or a channel in the memory device, the memory device can control or adjust the voltage level of a bit line select line or a drain select line (DSL), in order to avoid a transistor being in a floating state when controlled through the bit line select line or the drain select line (DSL). Because the transistor might be in the floating state, the bit line or channel could not be discharged appropriately.

In an embodiment, a memory device can adjust and change a setup time for adjusting a potential of a bit line after applying a program pulse during a unit programming operation in which a program pulse to memory cell is applied to a non-volatile memory cell in the memory device. As a result, it is possible to provide an apparatus and method that is capable of increasing the speed of the program operation and/or improving program operation efficiency.

For example, during an operation of applying a plurality of program pulses to non-volatile memory cells in the memory device in order to program the non-volatile memory cells with multi-bit data, the memory device can perform a unit program operation in which a second program pulse is applied after a first program pulse has been applied, in one of various modes.

The modes of the unit program operation can include a first program mode, a second program mode, and a third program mode. In the first program mode, the degree to which data is programmed in response to the second program pulse, e.g., a change or a shift of threshold voltage in a non-volatile memory cell when the second program pulse is applied, may be similar to or greater than the degree to which data is programmed in response to the first program pulse. In the second program mode, the degree to which data is programmed in response to the second program pulse is smaller than the degree to which data is programmed in response to the first program pulse. In the third program mode, the degree to which data is programmed in response to the second program pulse is non-existent, e.g., there is no change or no shift of the threshold voltage in the non-volatile memory cell even when the second program pulse is applied. The mode could be achieved based on a potential of the bit line coupled to a target memory cell when a program pulse is applied. If the discharge time could be reduced, the memory device can improve the efficiency or speed of the data program operation by adjusting and changing the setup time used to change or discharge the potential of the bit line.

According to an embodiment, the memory device can change or adjust a control voltage applied through the bit line select line or the drain select line (DSL) in response to a program operation environment (e.g., temperature) and a level (or size) or a number of applications regarding a program pulse applied to non-volatile memory cells during the data program operation. Accordingly, the memory device may reduce an operation margin corresponding to each program pulse during the data programming operation by applying a plurality of program pulses to a non-volatile memory cell. This may reduce the time spent on performing the data programming operation.

Referring again to FIG. 2, the memory device 150 is shown as included in a data processing system 100. According to an embodiment, the data processing system 100 may include a host 102 engaged or coupled with a memory system, such as memory system 110. For example, the host 102 and the memory system 110 can be coupled to each other via a data bus, a host cable and the like to perform data communication.

The memory system 110 may include the memory device 150 and a controller 130. The memory device 150 and the controller 130 in the memory system 110 may be considered components or elements physically separated from each other. The memory device 150 and the controller 130 may be connected via at least one data path. For example, the data path may include a channel and/or a way.

According to an embodiment, the memory device 150 and the controller 130 may be components or elements that are functionally divided. Further, according to an embodiment, the memory device 150 and the controller 130 may be implemented in a single chip or in a plurality of chips. The controller 130 may perform a data input/output operation in response to a request input from the external device. For example, when the controller 130 performs a read operation in response to a read request input from an external device, data stored in a plurality of non-volatile memory cells included in the memory device 150 is transferred to the controller 130.

In FIG. 2, the memory device 150 may include one or more memory blocks 152, 154, 156. The memory block 152, 154, 156 may be understood as a group of non-volatile memory cells in which data is removed together by a single erase operation. The memory block 152, 154, 156 may include at least one page, e.g., a group of non-volatile memory cells that store data together during a single program operation and/or that output data together during a single read operation. For example, one memory block may include a plurality of pages.

In one embodiment, the memory device 150 may include a plurality of memory planes or one or more memory dies. According to an embodiment, the memory plane may be considered a logical or a physical partition including at least one memory block, a driving circuit capable of controlling an array of a plurality of non-volatile memory cells, and a buffer that can temporarily store data input to, or output from, non-volatile memory cells.

According to an embodiment, each memory die may include at least one memory plane and may be understood as a set of components implemented on a physically distinguishable substrate. Each memory die may be connected to the controller 130 through a data path, and may include an interface to exchange an item of data and a signal with the controller 130.

According to an embodiment, the memory device 150 may include at least one memory block 152, 154, 156, at least one memory plane, or at least one memory die. The internal configuration of the memory device 150 (e.g., shown in FIG. 1) may be different according to performance of the memory system 110. An embodiment of the present disclosure is not limited to the internal configuration shown in FIG. 2.

In FIG. 2, the memory device 150 includes the voltage supply circuit 170 which is capable of supplying one or more voltages to the memory block(s) 152, 154, 156. The voltage supply circuit 170 can include a voltage generation circuit for generating target voltages for the memory block(s) 152, 154, 156, for example, as described with reference to FIGS. 4 to 8.

In an embodiment, the voltage supply circuit 170 may supply a read voltage Vrd, a program voltage Vprog, a pass voltage Vpass, or an erase voltage Vers into a non-volatile memory cell included in the memory block. For example, during a read operation for reading data stored in the non-volatile memory cell in the memory block(s) 152, 154, 156, the voltage supply circuit 170 may supply the read voltage Vrd to a selected non-volatile memory cell. During the program operation for storing data in the non-volatile memory cell in the memory block(s) 152, 154, 156, the voltage supply circuit 170 may supply the program voltage Vprog into a selected non-volatile memory cell. During a read operation or a program operation performed on the selected non-volatile memory cell, the voltage supply circuit 170 may supply a pass voltage Vpass to a non-selected non-volatile memory cell. During the erasing operation for erasing data stored in the non-volatile memory cell in the memory block(s) 152, 154, 156, the voltage supply circuit 170 may supply the erase voltage Vers to the memory block.

The memory device 150 may store information regarding various voltages which are supplied to the memory block(s) 152, 154, 156 based on which operation is performed. For example, when a non-volatile memory cell in the memory block(s) 152, 154, 156 can store multi-bit data, plural levels of the read voltage Vrd for recognizing or reading the multi-bit data item may be used. The memory device 150 may include a table with information indicating plural levels of the read voltage Vrd corresponding to the multi-bit data item. For example, the table can include bias values stored in a register, with each bias value corresponding to a specific level of the read voltage Vrd. The number of bias values for the read voltage Vrd that is used for a read operation may be limited to a preset range. Also, in one embodiment, the bias values can be quantized.

The host 102 may include a portable electronic device (e.g., a mobile phone, an MP3 player, a laptop computer, etc.) or a non-portable electronic device (e.g., a desktop computer, a game player, a television, a projector, etc.). According to an embodiment, the host 102 can include a central processing unit (CPU) included in the portable electronic device and the non-portable electronic device.

The host 102 may include at least one operating system (OS), which can control functions and operations performed in the host 102. The OS can provide interoperability between the host 102 engaged operatively with the memory system 110 and a user who intends to store data in the memory system 110. The OS may support functions and operations corresponding to user requests. By the way of example but not limitation, the OS can be classified into a general operating system and a mobile operating system according to mobility of the host 102. The general operating system may be split into a personal operating system and an enterprise operating system according to system requirements or a user environment. As compared with the personal operating system, the enterprise operating systems can be specialized for securing and supporting high performance computing.

The mobile operating system may be subject to support services or functions for mobility (e.g., a power saving function). The host 102 may include a plurality of operating systems. The host 102 may execute multiple operating systems interlocked with the memory system 110, corresponding to a user request. The host 102 may transmit a plurality of commands corresponding to user requests to the memory system 110, thereby performing operations corresponding to the plurality of commands within the memory system 110.

The controller 130 may control the memory device 150 in response to a request or a command from the host 102. For example, the controller 130 may perform a read operation to provide data read from the memory device 150 to the host 102 and may perform a write operation (or a program operation) to store data input from the host 102 in the memory device 150. In order to perform data input/output (I/O) operations, the controller 130 may control and manage internal operations of reading data, programming data, erasing data, or the like.

According to an embodiment, the controller 130 may include a host interface (I/F) 132, a processor 134, error correction circuitry (ECC) 138, a power management unit (PMU) 140, a memory interface (I/F) 142, and a memory 144. Components in the controller 130 as illustrated in FIG. 2 may vary according to structures, functions, operation performance, or the like, regarding the memory system 110.

For example, the memory system 110 may be implemented with any of various types of storage devices (electrically coupled with the host 102) according to a protocol of a host interface. Non-limiting examples of suitable storage devices include a solid state drive (SSD), a multimedia card (MMC), an embedded MMC (eMMC), a reduced size MMC (RS-MMC), a micro-MMC, a secure digital (SD) card, a mini-SD, a micro-SD, a universal serial bus (USB) storage device, a universal flash storage (UFS) device, a compact flash (CF) card, a smart media (SM) card, a memory stick, and the like. Components may be added to or omitted from the controller 130 according to implementation of the memory system 110.

Each of the host 102 and the memory system 110 may include a controller or an interface for transmitting and receiving signals, data, and the like, in accordance with one or more predetermined protocols. For example, the host interface 132 in the memory system 110 may include an apparatus capable of transmitting signals, data, and the like to the host 102 or receiving signals, data, and the like from the host 102.

The host interface 132 may receive signals, commands (or requests), and/or data input from the host 102. For example, the host 102 and the memory system 110 may use a predetermined protocol to transmit and receive data therebetween. Examples of communication standards or interfaces supported by the host 102 and the memory system 110 for sending and receiving data include Universal Serial Bus (USB), Multi-Media Card (MMC), Parallel Advanced Technology Attachment (PATA), Small Computer System Interface (SCSI), Enhanced Small Disk Interface (ESDI), Integrated Drive Electronics (IDE), Peripheral Component Interconnect Express (PCIe or PCI-e), Serial-attached SCSI (SAS), Serial Advanced Technology Attachment (SATA), Mobile Industry Processor Interface (MIPI), and the like. According to an embodiment, the host interface 132 is a type of layer for exchanging data with the host 102 and is implemented with, or driven by, firmware called a host interface layer (HIL).

The Integrated Drive Electronics (IDE) or Advanced Technology Attachment (ATA) may be used as one of the interfaces for transmitting and receiving data and, for example, may use a cable including 40 wires connected in parallel to support data transmission and data reception between the host 102 and the memory system 110. When a plurality of memory systems 110 are connected to a single host 102, the plurality of memory systems 110 may be divided into a master and a slave using a position or a dip switch to which the plurality of memory systems 110 are connected. The memory system 110 set as the master may be used as a main memory device. The IDE (ATA) may include, for example, Fast-ATA, ATAPI, or Enhanced IDE (EIDE).

A Serial Advanced Technology Attachment (SATA) interface is a type of serial data communication interface that is compatible with various ATA standards of parallel data communication interfaces used by Integrated Drive Electronics (IDE) devices. The 40 wires in the IDE interface can be reduced to six wires in the SATA interface. For example, 40 parallel signals for the IDE can be converted into 6 serial signals for the SATA interface. The SATA interface has been widely used because of its faster data transmission and reception rate and its less resource consumption in the host 102 used for the data transmission and reception. The SATA interface may connect up to 30 external devices to a single transceiver included in the host 102. In addition, the SATA interface can support hot plugging that allows an external device to be attached to or detached from the host 102, even while data communication between the host 102 and another device is being executed. Thus, the memory system 110 can be connected or disconnected as an additional device, like a device supported by a universal serial bus (USB) even when the host 102 is powered on. For example, in the host 102 having an eSATA port, the memory system 110 may be freely attached to or detached from the host 102 like an external hard disk.

Small Computer System Interface (SCSI) is a type of serial data communication interface used for connecting a computer or a server with other peripheral devices. The SCSI can provide high transmission speed compared with other interfaces such as IDE and SATA. In the SCSI, the host 102 and at least one peripheral device (e.g., memory system 110) are connected in series, but data transmission and reception between the host 102 and each peripheral device may be performed through a parallel data communication. In the SCSI, it is easy to connect or disconnect a device such as the memory system 110 to or from the host 102. The SCSI can support connections of 15 other devices to a single transceiver included in host 102.

Serial Attached SCSI (SAS) can be understood as a serial data communication version of the SCSI. In SAS, the host 102 and a plurality of peripheral devices are connected in series, and data transmission and reception between the host 102 and each peripheral device may be performed in a serial data communication scheme. Also, SAS can support connection between the host 102 and the peripheral device through a serial cable instead of a parallel cable, to easily manage equipment using the SAS and enhance or improve operational reliability and communication performance. Also, SAS may support connections of eight external devices to a single transceiver included in the host 102.

The Non-volatile memory express (NVMe) is a type of interface based at least on a Peripheral Component Interconnect Express (PCIe) designed to increase performance and design flexibility of the host 102, servers, computing devices, and the like equipped with the non-volatile memory system 110. PCIe can use a slot or a specific cable for connecting a computing device (e.g., host 102) and a peripheral device (e.g., memory system 110). For example, PCIe can use a plurality of pins (e.g., 18 pins, 32 pins, 49 pins, or 82 pins) and at least one wire (e.g., ×1, ×4, ×8, or ×16) to achieve high speed data communication over several hundred MB per second (e.g., 250 MB/s, 500 MB/s, 984.6250 MB/s, or 1969 MB/s). According to an embodiment, a PCIe scheme may achieve bandwidths of tens to hundreds of Giga bits per second. NVMe can support an operation speed of the non-volatile memory system 110, such as an SSD, that is faster than a hard disk.

According to an embodiment, the host 102 and the memory system 110 may be connected through a universal serial bus (USB). The Universal Serial Bus (USB) is a type of scalable, hot-pluggable plug-and-play serial interface that can provide cost-effective standard connectivity between the host 102 and peripheral devices, e.g., a keyboard, a mouse, a joystick, a printer, a scanner, a storage device, a modem, a video camera, and the like. A plurality of peripheral devices such as the memory system 110 may be coupled to a single transceiver included in the host 102.

The error correction circuitry 138 can correct error bits of data read from the memory device 150, and may include an error correction code (ECC) encoder and an ECC decoder. The ECC encoder may perform error correction encoding of data to be programmed in the memory device 150 in order to generate encoded data into which a parity bit is added. The encoded data may be stored in memory device 150. The ECC decoder can detect and correct error bits contained in the data read from the memory device 150 when the controller 130 reads the data stored in the memory device 150. For example, after performing error correction decoding on the data read from the memory device 150, the error correction circuitry 138 determines whether the error correction decoding has succeeded or not and outputs an instruction signal, e.g., a correction success signal or a correction fail signal, based on a result of the error correction decoding. The error correction circuitry 138 may use a parity bit generated during the ECC encoding process for the data stored in the memory device 150, in order to correct the error bits of the read data. When the number of the error bits is greater than or equal to the number of correctable error bits, the error correction circuitry 138 may not correct the error bits and instead may output the correction fail signal indicating failure in correcting the error bits.

According to an embodiment, the error correction circuitry 138 may perform an error correction operation based on coded modulation. Examples include a low density parity check (LDPC) code, a Bose-Chaudhuri-Hocquenghem (BCH) code, a turbo code, a Reed-Solomon (RS) code, a convolution code, a recursive systematic code (RSC), a trellis-coded modulation (TCM), a Block coded modulation (BCM), or the like. The error correction circuitry 138 may include all circuits, modules, systems, and/or devices for performing the error correction operation based on at least one of the above described codes. In an embodiment, the error correction circuitry 138 can include at least some of components in the controller 130 shown in FIG. 1.

The ECC decoder may perform hard decision decoding or soft decision decoding on data transmitted from the memory device 150. Hard decision decoding can be understood as one of two methods broadly classified for error correction. Hard decision decoding may include, for example, an operation of correcting an error bit by reading digital data of '0' or '1' from a non-volatile memory cell in the memory device 150. Because the hard decision decoding handles a binary logic signal, the circuit/algorithm design or configuration may be simpler and a processing speed may be faster than the soft decision decoding.

Soft decision decoding may quantize a threshold voltage of a non-volatile memory cell in the memory device 150 by two or more quantized values, e.g., multiple bit data, approximate values, an analog value, and the like, in order to correct an error bit based on the two or more quantized values. The controller 130 can receive two or more alphabets or quantized values from a plurality of non-volatile memory cells in the memory device 150, and then perform a decoding based on information generated by characterizing the quantized values as a combination of information such as conditional probability or likelihood.

According to an embodiment, the ECC decoder may use low-density parity-check and generator matrix (LDPC-GM) code among methods designed for the soft decision decoding. A low-density parity-check (LDPC) code uses an algorithm that can read values of data from the memory device 150 in several bits according to reliability, not simply data of 1 or 0 like the hard decision decoding, and iteratively repeats it through a message exchange in order to improve reliability of the values. Then, the values are finally determined as data of 1 or 0. For example, a decoding algorithm using LDPC codes can be understood as probabilistic decoding. Hard decision decoding in which a value output from a non-volatile memory cell, is coded as 0 or 1.

Compared to hard decision decoding, soft decision decoding can determine the value stored in the non-volatile memory cell based on the stochastic information. Regarding bit-flipping which may be considered an error that can occur in the memory device 150, soft decision decoding may provide improved probability of correcting the error and recovering data, as well as providing reliability and stability of corrected data. The LDPC-GM code may have a scheme in which internal low-density generator matrix (LDGM) codes can be concatenated in series with high-speed LDPC codes.

According to an embodiment, the ECC decoder may use, for example, low-density parity-check convolutional codes (LDPC-CCs) for the soft decision decoding. The LDPC-CCs may correspond to a scheme using a linear time encoding and a pipeline decoding based on a variable block length and a shift register.

According to an embodiment, the ECC decoder may use, for example, a Log Likelihood Ratio Turbo Code (LLR-TC) for soft decision decoding. A Log Likelihood Ratio (LLR) may be calculated as a non-linear function for a distance between a sampled value and an ideal value. In addition, a Turbo Code (TC) may include a simple code for example, a Hamming code, in two or three dimensions and repeat decoding in a row direction and a column direction to improve reliability of values.

The power management unit (PMU) 140 may control electrical power provided to the controller 130. The PMU 140 may monitor the electrical power supplied to the memory system 110, e.g., a voltage supplied to the controller 130, and provide the electrical power to components included in the controller 130. The PMU 140 may not only detect power-on or power-off, but may also generate a trigger signal to enable the memory system 110 to urgently back up a current state when the electrical power supplied to the memory system 110 is unstable. According to an embodiment, the PMU 140 may include a device or a component capable of accumulating electrical power that may be used in an emergency.

The memory interface 142 may serve as an interface for handling commands and data transferred between the controller 130 and the memory device 150, in order to allow the controller 130 to control the memory device 150 in response to a command or a request input from the host 102. When the memory device 150 is a flash memory, the memory interface 142 may generate a control signal for the memory device 150 and may process data input to, or output from, the memory device 150 under the control of the processor 134.

For example, when the memory device 150 includes a NAND flash memory, the memory interface 142 includes a NAND flash controller (NFC). The memory interface 142 can provide an interface for handling commands and data between the controller 130 and the memory device 150. In accordance with an embodiment, the memory interface 142 can be implemented through, or driven by, firmware called a Flash Interface Layer (FIL) for exchanging data with the memory device 150.

According to an embodiment, the memory interface 142 may support an open NAND flash interface (ONFi), a toggle mode, or the like, for data input/output with the memory device 150. For example, the ONFi may use a data path, e.g., a channel, a way, etc., that includes at least one signal line capable of supporting bi-directional transmission and reception in a unit of 8-bit or 16-bit data. Data communication between the controller 130 and the memory device 150 can be achieved through at least one interface regarding an asynchronous single data rate (SDR), a synchronous double data rate (DDR), a toggle double data rate (DDR), or the like.

The memory 144 may be used as a working memory of the memory system 110 or the controller 130, while temporarily storing transactional data of operations performed in the memory system 110 and the controller 130. For example, the memory 144 may temporarily store read data output from the memory device 150 in response to a read request from the host 102 before the read data is output to the host 102.

In addition, the controller 130 may temporarily store write data input from the host 102 in the memory 144 before programming the write data in the memory device 150. When the controller 130 controls operations such as a data read operation, a data write or program operation, a data erase operation, etc. of the memory device 150, data transmitted between the controller 130 and the memory device 150 of the memory system 110 may be temporarily stored in the memory 144.

In addition to the read data or write data, the memory 144 may store information, e.g., map data, read requests, program requests, etc., used for inputting or outputting data between the host 102 and the memory device 150. According to an embodiment, the memory 144 may include one or more of a command queue, a program memory, a data memory, a write buffer/cache, a read buffer/cache, a data buffer/cache, a map buffer/cache, and so on. The controller 130 may allocate some storage space in the memory 144 for a component which is established to carry out a data input/output operation. For example, the write buffer established in the memory 144 may be used to temporarily store target data subject to a program operation.

In an embodiment, the memory 144 may be implemented with a volatile memory. For example, the memory 144 may be implemented with a static random access memory (SRAM), a dynamic random access memory (DRAM), or both. Although FIG. 2 illustrates that the memory 144 disposed within the controller 130, embodiments are not limited thereto. The memory 144 may be located within or external to the controller 130. For instance, the memory 144 may be embodied by an external volatile memory having a memory interface for transferring data and/or signals between the memory 144 and the controller 130.

The processor 134 may control overall operations of the memory system 110. For example, the processor 134 can control a program operation or a read operation of the memory device 150 in response to a write request or a read request entered from the host 102. According to an embodiment, the processor 134 may execute firmware to control the program operation or the read operation in the memory system 110. The firmware may be, for example, a flash translation layer (FTL). According to an embodiment, the processor 134 may be implemented with a microprocessor, a central processing unit (CPU), or another processing device.

According to an embodiment, the memory system 110 may be implemented with at least one multi-core processor. The multi-core processor is a type of circuit or chip in which two or more cores, which are considered distinct processing regions, are integrated. For example, when a plurality of cores in the multi-core processor drive or execute a plurality of flash translation layers (FTLs) independently, a data input/output speed (or performance) of the memory system 110 may be improved. According to an embodiment, the data input/output (I/O) operations in the memory system 110 may be independently performed through different cores in the multi-core processor.

The processor 134 in the controller 130 may perform an operation corresponding to a request or a command input from the host 102. Further, the memory system 110 may perform an operation independent from a command or a request input from the host 102. In one case, an operation performed by the controller 130 in response to the request or the command input from the host 102 may be considered a foreground operation, while an operation performed by the controller 130 independently from the request or the command input from the host 102 may be considered a background operation. The controller 130 can perform foreground or background operations for reading, writing, or erasing data in the memory device 150. In addition, a parameter set operation corresponding to a set parameter command or a set feature command as a set command transmitted from the host 102 may be considered a foreground operation. Examples of background operations that may be performed without a command transmitted from the host 102, are that the controller 130 can perform garbage collection (GC), wear leveling (WL), bad block management for identifying and processing bad blocks, or the like.

According to an embodiment, substantially similar operations may be performed as both the foreground operation and the background operation. For example, when the memory system 110 performs garbage collection in response to a request or a command input from the host 102, e.g., manual GC, the garbage collection can be considered a foreground operation. When the memory system 110 performs garbage collection independently of the host 102, e.g., auto GC, the garbage collection can be considered a background operation.

When the memory device 150 includes a plurality of dies (or a plurality of chips) each including a plurality of non-volatile memory cells, the controller 130 may perform parallel processing regarding plural requests or commands input from the host 102 in order to improve performance of the memory system 110. For example, the transmitted requests or commands may be divided into plural groups including at least some of a plurality of planes, a plurality of dies, or a plurality of chips included in the memory device 150, and the plural groups of requests or commands are processed individually or in parallel in each plane, each die or each chip.

The memory interface 142 in the controller 130 may be connected to the plurality of dies or chips in the memory device 150 through at least one channel and at least one way. When the controller 130 distributes and stores data in the plurality of dies through each channel or each way in response to requests or commands associated with a plurality of pages including non-volatile memory cells, a plurality of operations corresponding to the requests or the commands can be performed simultaneously or in parallel in the plurality of dies or planes. Such a processing method or scheme can be considered as an interleaving method. Because a data input/output speed of the memory system 110 increases by operating with the interleaving method, data I/O performance of the memory system 110 can be improved.

By way of example but not limitation, the controller 130 can recognize statuses of a plurality of channels (or ways) associated with the plurality of dies included in the memory device 150. The controller 130 may determine a status of each channel or each way as one of a busy status, a ready status, an active status, an idle status, a normal status, and an abnormal status. The determination of which channel or way an instruction and/or a data is delivered through by the controller 130 can be associated with a physical block address. The controller 130 may refer to descriptors delivered from the memory device 150. The descriptors may include a block or page of parameters describing something about the memory device 150. The descriptors can have a predetermined format or structure. For instance, the descriptors may include device descriptors, configuration descriptors, unit descriptors, and the like. The controller 130 may refer to, or use, the descriptors to determine which channel(s) or way(s) is used to exchange an instruction or data.

As above described, the memory device 150 in the memory system 110 may include one or more memory blocks 152, 154, 156. Each of the memory blocks 152, 154, 156 includes a plurality of non-volatile memory cells. According to an embodiment, the memory blocks 152, 154, 156 can be a group of non-volatile memory cells erased together. The memory blocks 152, 154, 156 may include a plurality of pages which is a group of non-volatile memory cells read or programmed together.

In one embodiment, each of the memory blocks 152, 154, 156 may have a three-dimensional stack structure for high integration. Further, the memory device 150 may include a plurality of dies, each die including a plurality of planes, each plane including the memory blocks 152, 154, 156. A configuration of the memory device 150 may be changed depending on performance of the memory system 110.

In FIG. 2, the memory device 150 includes memory blocks 152, 154, and 156 which may be any of single-level cell (SLC) memory blocks, multi-level cell (MLC) memory blocks, or the like, based on the number of bits that can be stored in one memory cell. An SLC memory block includes a plurality of pages implemented by memory cells, each memory cell storing one bit of data. An SLC memory block may have higher data I/O operation performance and higher durability than the MLC memory block. The MLC memory block includes a plurality of pages implemented by memory cells, with each memory cell storing multi-bit data, e.g., two or more bits of data. The MLC memory block may have larger storage capacity for the same space compared to the SLC memory block. The MLC memory block can be highly integrated in view of storage capacity.

In an embodiment, the memory device 150 may be implemented with MLC memory blocks such as a double level cell (DLC) memory block, a triple-level cell (TLC) memory block, a quadruple-level cell (QLC) memory block, and a combination thereof. A DLC memory block may include a plurality of pages implemented by memory cells, with each memory cell capable of storing 2-bit data. A TLC memory block can include a plurality of pages implemented by memory cells, with each memory cell capable of storing 3-bit data. A QLC memory block can include a plurality of pages implemented by memory cells, with each memory cell capable of storing 4-bit data. In another embodiment, the memory device 150 can be implemented with a block including a plurality of pages implemented by memory cells, with each memory cell capable of storing five or more bits of data.

According to an embodiment, the controller 130 may use an MLC memory block included in the memory device 150 as an SLC memory block that stores one-bit data in one memory cell. A data input/output speed of the multi-level cell (MLC) memory block can be slower than that of the SLC memory block. For example, when the MLC memory block is used as the SLC memory block, the margin for a read or program operation can be reduced. For example, the controller 130 may perform a data input/output operation with a higher speed when the MLC memory block is used as the SLC memory block. Thus, the controller 130 may use the MLC memory block as a SLC buffer to temporarily store data because the buffer may require a high data input/output speed for improving performance of the memory system 110.

According to an embodiment, the controller 130 can program data in an MLC a plurality of times without performing an erase operation on a specific MLC memory block included in the memory device 150. In general, non-volatile memory cells do not support data overwrite. However, the controller 130 may program 1-bit data in the MLC a plurality of times using a feature in which the MLC is capable of storing multi-bit data. For an MLC overwrite operation, the controller 130 may store the number of program times as separate operation information when 1-bit data is programmed in an MLC. According to an embodiment, an operation for uniformly levelling threshold voltages of the MLCs may be carried out before another 1-bit data is programmed in the same MLCs, each having stored another-bit data.

In an embodiment, the memory device 150 is embodied as a non-volatile memory such as a flash memory, for example, as a NAND flash memory, a NOR flash memory, or the like. In another embodiment, the memory device 150 may be implemented by at least one of a phase change random access memory (PCRAM), a ferroelectrics random access memory (FRAM), a spin transfer torque random access memory (SU-RAM), and a spin transfer torque magnetic random access memory (STT-MRAM), or the like.

Figure 3A:
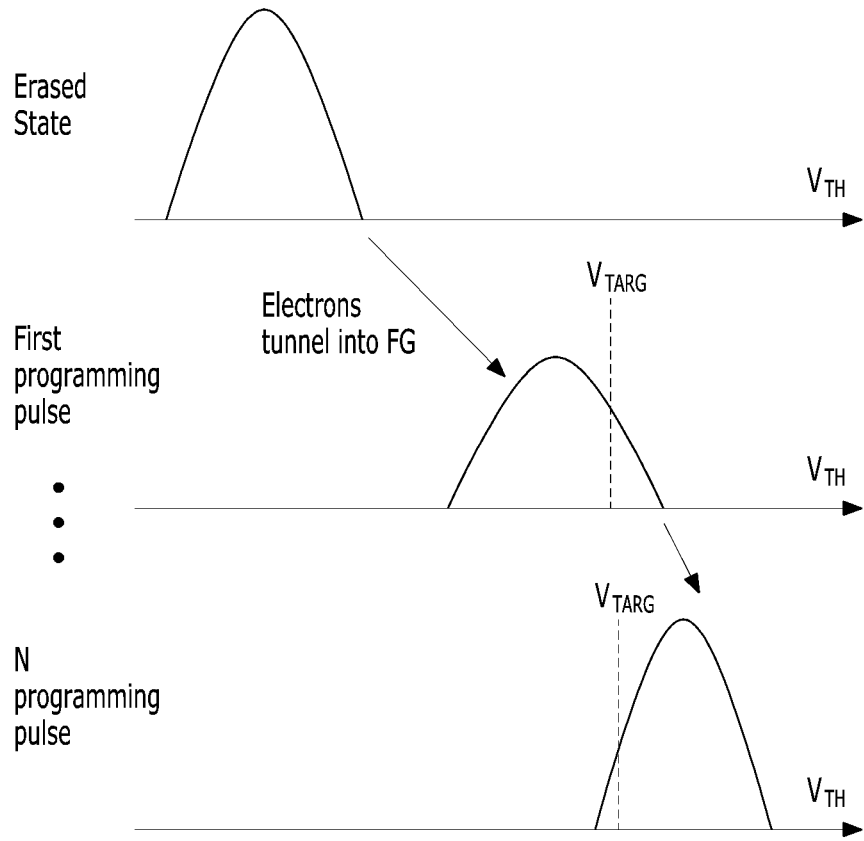
FIGS. 3A and 3B illustrate an Incremental Step Pulse Programming (ISPP) operation according to an embodiment of the present disclosure.
Figure 3B:
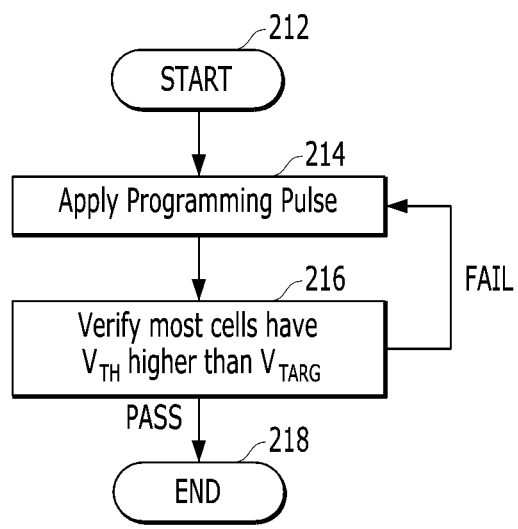

FIGS. 3A and 3B illustrate an Incremental Step Pulse Programming (ISPP) operation according to an embodiment of the present disclosure.

Referring to FIG. 3A, data may be programmed in a non-volatile memory cell that is in an erased state. When a programming pulse is supplied to a word line coupled to the non-volatile memory cell, the threshold voltage distribution of the non-volatile memory cell may shift from the erased state to the right, e.g., a direction in which the threshold voltage increases. If the programming pulse is continuously supplied to the non-volatile memory cell, the threshold voltage distribution of the non-volatile memory cell may continuously shift to the right. The programming pulse may be supplied until most of the plurality of non-volatile memory cells have a threshold voltage higher than the target voltage $V_{TARG}$ in a threshold voltage distribution.

In FIG. 3B, when a program operation starts (operation 212), the memory device 150 can apply a programming pulse to a plurality of non-volatile memory cells to be programmed with data (operation 214). After a programming pulse is applied, the memory device 150 can verify whether most of the plurality of non-volatile memory cells have a threshold voltage $V_{TH}$ higher than the target voltage $V_{TARG}$ (operation 216). When it is determined that most of the plurality of non-volatile memory cells do not have a threshold voltage $V_{TH}$ higher than the target voltage $V_{TARG}$ according to a verification result FAIL, the memory device 150 applies another programming pulse to the corresponding non-volatile memory cells (operation 214). When most of the plurality of non-volatile memory cells have a threshold voltage $V_{TH}$ higher than the target voltage $V_{TARG}$ according to another verification result PASS, the memory device 150 may end the program operation (operation 218).

In order to narrow the threshold voltage distribution of the plurality of non-volatile memory cells, it is advantageous to slightly shift, e.g., by a first amount, the threshold voltage distribution of the plurality of non-volatile memory cells to the right rather than greatly shifting them, e.g., by a second amount greater than the first amount, to the right when a single programming pulse is applied. On the other hand, when the threshold voltage distribution of the plurality of non-volatile memory cells is slightly shifted to the right, the number of times the programming pulse is applied may increase.

According to an embodiment, three times or more than the number of bits of data may be stored in the non-volatile memory cell. For example, when 2 bits of data can be stored in a non-volatile memory cell, the non-volatile memory cell may have four programmed states, e.g., '00', '01', '10', and 11', corresponding to 2-bit data. In order to form a tighter threshold voltage distribution, e.g., a narrower distribution, a degree to which the threshold voltage distribution of a plurality of non-volatile memory cells is shifted to the right, in response to a single programming pulse, can be smaller than a difference in two adjacent programmed states. For example, when two or more programming pulses are applied, it can be designed to move by a difference between two adjacent programmed states. In this case, the number of times of applying the programming pulse may be 8 times or more, which is more than 4 times than the number of bits of data.

According to an embodiment, the degree to which the threshold voltage distribution of the plurality of non-volatile memory cells moves when a single programming pulse is applied may be understood as a target level. An example of the target level is described in greater detail for the embodiment of FIG. 6.

Figure 4:
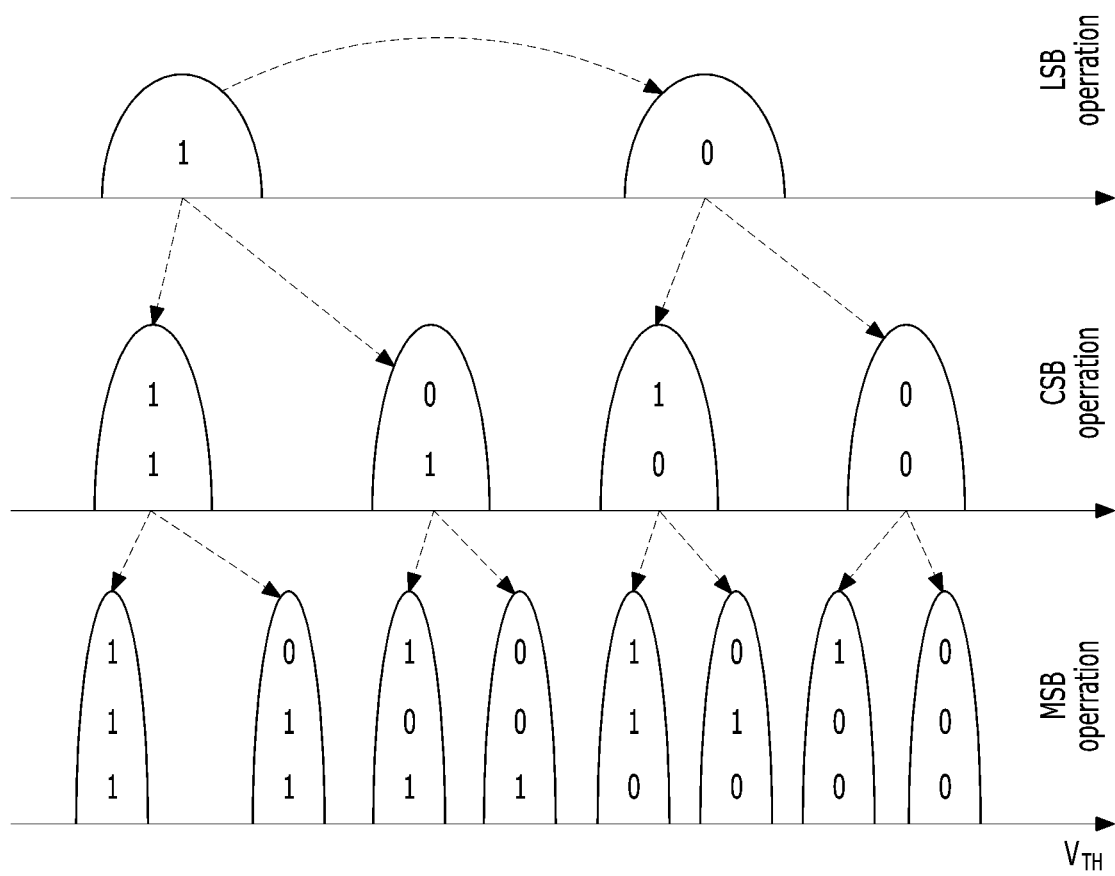
FIG. 4 illustrates a method for storing multi-bit data in a non-volatile memory cell according to an embodiment of the present disclosure.

FIG. 4 illustrates a method for storing multi-bit data in a non-volatile memory cell according to an embodiment of the present disclosure. The method of FIG. 4 may include a program operation performed in the memory device 150 including non-volatile memory cells, each capable of storing 3-bit data.

Data stored in the non-volatile memory cell may be distinguishable based on a level of threshold voltage $V_{TH}$ of the corresponding memory cell. The threshold voltage $V_{TH}$ of the memory cell can vary depending on a quantity of electrons or charges injected into a floating gate of the corresponding memory cell. A single-level cell SLC may be divided into two ranges of the threshold voltage $V_{TH}$, to store 1-bit data of "0" or "1". On the other hand, a triple-level cell TLC in the memory device 150 may have eight threshold voltage ranges.

Referring to FIG. 4, in order to reduce the number of applications of programming pulses in an incremental step pulse programming (ISPP) operation, the application of program pulses applied to the triple level cell TLC in response to bits of data stored in the triple level cell TLC can be controlled differently. Data stored in the triple-level cell TLC can be divided into LSB data, CSB data, and MSB data. In a process of programming the LSB data, the number of times of applying the programming pulses may be the smallest, and the number of times of applying the programming pulses in a process of programming the CSB data may be greater than that of programming the LSB data. In a process of programming the MSB data, the number of times of applying the programming pulses can be the largest.

In a memory device including a triple-level cell (TLC), each physical page may be divided into three logical pages that are an LSB page, a CSB page, and an MSB page. A programming pulse applied to each page can be different. For example, shifts of different positive threshold voltage ($V_{TH}$) distributions may be induced in processes of programming the LSB, CSB, and MSB data. In one embodiment, the threshold voltages $V_{TH}$ of the plurality of non-volatile memory cells can move the most in the process of programming the LSB page, and the threshold voltages $V_{TH}$ of the plurality of non-volatile memory cells can move the least in a process of programming the MSB page. According to an embodiment, when the number of times a programming pulse is applied in the process of programming the LSB page is the least, delay time can be the shortest and power consumption can also be the smallest. On the other hand, in the process of programming the MSB page, the number of times that the programming pulse is applied may increase so that the delay time and the power consumption can be increased.

Figure 5:
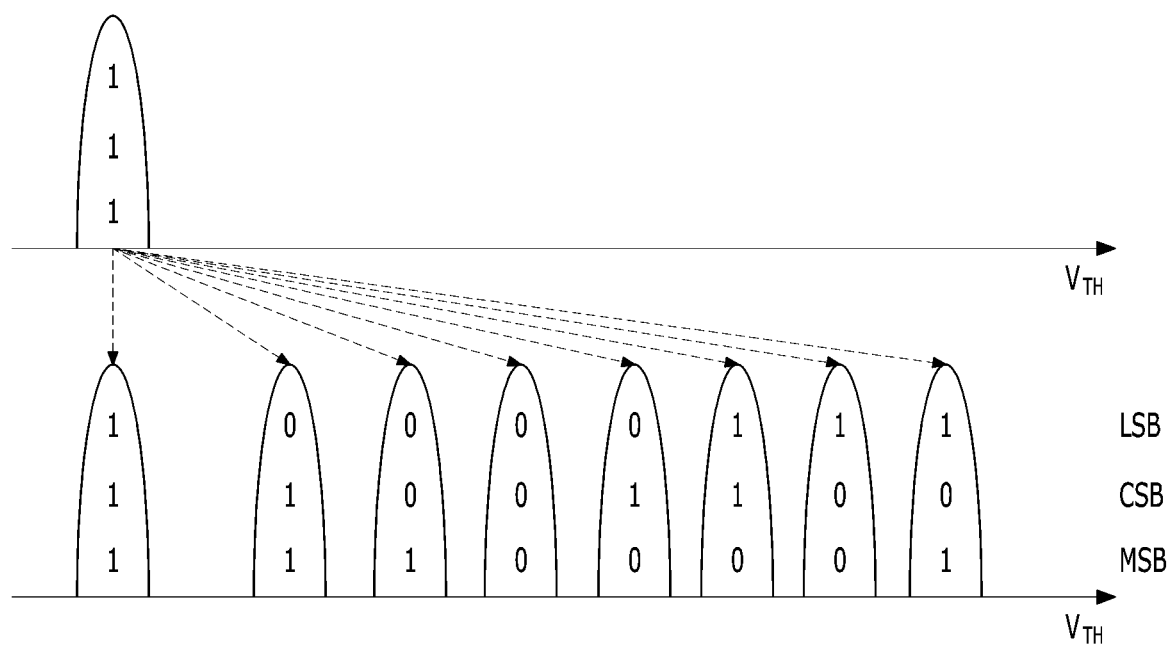
FIG. 5 illustrates another method for storing multi-bit data in a non-volatile memory cell according to an embodiment of the present disclosure.

FIG. 5 illustrates another method for storing multi-bit data in a non-volatile memory cell according to an embodiment of the present disclosure. In FIG. 5, a program operation performed by the memory device 150 including a non-volatile memory cell capable of storing 3-bit data will be described as an example.

Referring to FIG. 5, the memory device 150 may not sequentially divide the operation of storing 3-bit data in the non-volatile memory cell into LSB, CSB, and MSB program operations. In order to store the 3-bit data in the non-volatile memory cell without separation, code values for LSB, CSB, and MSB corresponding to eight program states can be different from those shown in FIG. 4. The 3-bit data corresponding to 8 program states can be determined as gray codes, and the code values for LSB, CSB, and MSB can be differently set. Herein, the gray code is a code made to change the value of only one bit (1 bit) between adjacent data when data is changed. For example, it may be understood that data in the erase state is '111', and data in the lowest program state is '011'. Data of the second lowest program state adjacent to data '011' of the lowest program state may be '001'.

Referring to FIGS. 4 and 5, code values of LSB, CSB, and MSB may be different according to how to store multi-bit data in a non-volatile memory cell. For example, the code value corresponding to the MSB of eight program states shown in FIG. 4 may be '10101010', while the code value of the MSB of eight program states shown in FIG. 5 may be '11100001'. According to an embodiment, the code values for the LSB and the MSB described in FIGS. 4 and 5 can be different according to an embodiment.

Figure 6:
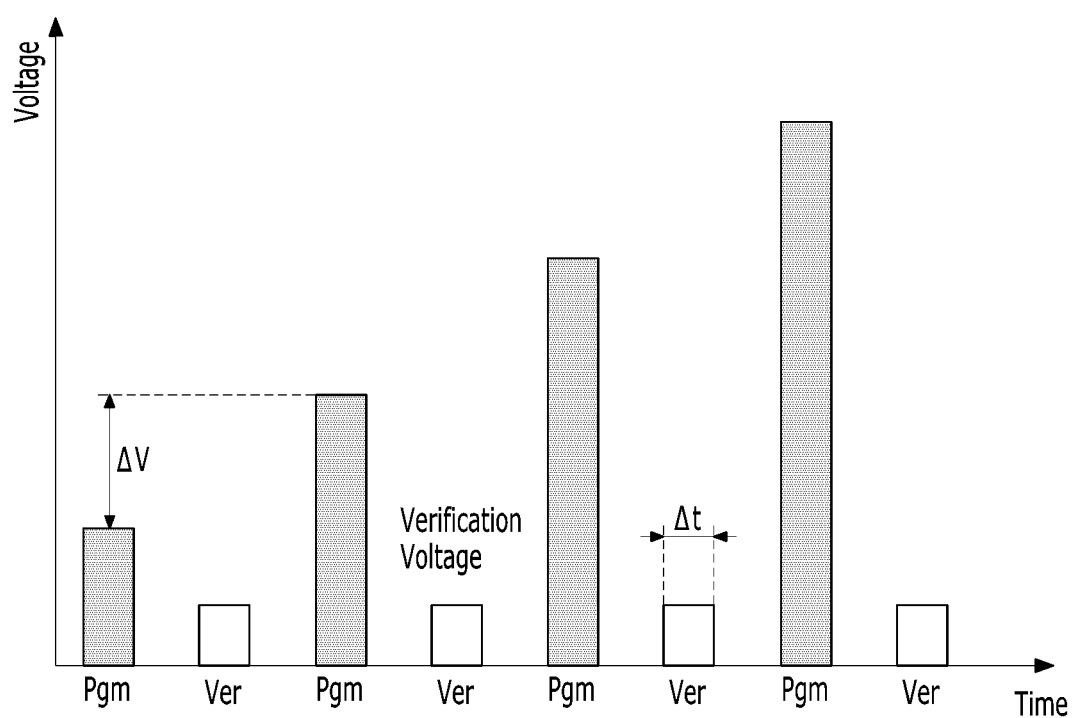
FIG. 6 illustrates a program operation and a verification operation of the Incremental Step Pulse Programming (ISPP) operation according to an embodiment of the present disclosure.

FIG. 6 illustrates a program voltage application operation and a verification operation of the ISPP operation according to an embodiment of the present disclosure.

Referring to FIG. 6, after the program voltage application operation Pgm is performed during the ISPP operation, the memory device 150 performs a verification operation Ver corresponding to the program voltage application operation Pgm. Each program voltage application operation Pgm can increase the threshold voltage $V_{TH}$ of the non-volatile memory cell (i.e., shift in a right direction of x-axis). For example, each program voltage application operation Pgm increases the threshold voltage $V_{TH}$ of the non-volatile memory cell by the first potential difference ΔV.

After the program voltage application operation Pgm is performed, the threshold voltage $V_{TH}$ of the non-volatile memory cell may be compared with a verification voltage in the verification operation. When the threshold voltage $V_{TH}$ of the non-volatile memory cell is lower than the verification voltage, the next program voltage application operation Pgm may be performed again to add more electrons into a floating gate of the non-volatile memory cell. Thereafter, the verification operation Ver is performed in response to the corresponding program voltage application operation Pgm. The repeated program voltage application operation Pgm may be performed until the threshold voltage $V_{TH}$ of the non-volatile memory cell reaches a target voltage (e.g., a verification voltage).

According to an embodiment, the number of repetitions of the program voltage application operation Pgm and the verification operation Ver may vary depending on a standby time or delay time, power consumption, accuracy, and the like. When the threshold voltage $V_{TH}$ of the non-volatile memory cell is finely increased through the program voltage application operation Pgm, accuracy of the program voltage application operation can be increased. However, delay time and power consumption can be longer and greater as a greater number of program voltage application operations can be performed. On the other hand, when the threshold voltage $V_{TH}$ of the non-volatile memory cell is greatly increased through each program voltage application operation Pgm, power consumption and operation time of the program voltage application operation Pgm may be increased and shorter. The operation times Δt of the program voltage application operation Pgm and the verification operation Ver may vary according to a goal of each program voltage application operation Pgm, e.g., a change of the threshold voltage $V_{TH}$.

Referring to FIGS. 4 and 5, in a memory device including a triple-level non-volatile memory cell TLC, the program voltage application operation Pgm and the verification operation Ver may be differently performed based on purpose and procedure of programming data in the least significant bit LSB, the center significant bit CSB and the most significant bit MSB of the memory cell. In FIG. 4, a memory device including a triple level non-volatile memory cell TLC has been described as an example, but the above-described program operation can also be applied to a memory device including a quadruple level non-volatile memory cell (QLC) for storing 4-bit data or a non-volatile memory cell capable of storing 5 or more bit data.

According to an embodiment, for each program loop during the ISPP operation, a voltage level of the program pulse applied to the non-volatile memory cell in the program voltage application operation Pgm may be gradually increased by a preset voltage V. However, a voltage level of the verification pulse applied to the non-volatile memory cell in the verification operation Ver corresponding to the program voltage application operation Pgm may be substantially the same, e.g., not changed. In the verification operation Ver for each program loop, substantially the same verification pulse is applied to the non-volatile memory cell, but the time Δt for applying the verification pulse may vary. When the verification operation is performed by reflecting a noise generated according to operating characteristics of the memory device 150, the memory device 150 may change or adjust a voltage level of the verification pulse.

Figure 7:
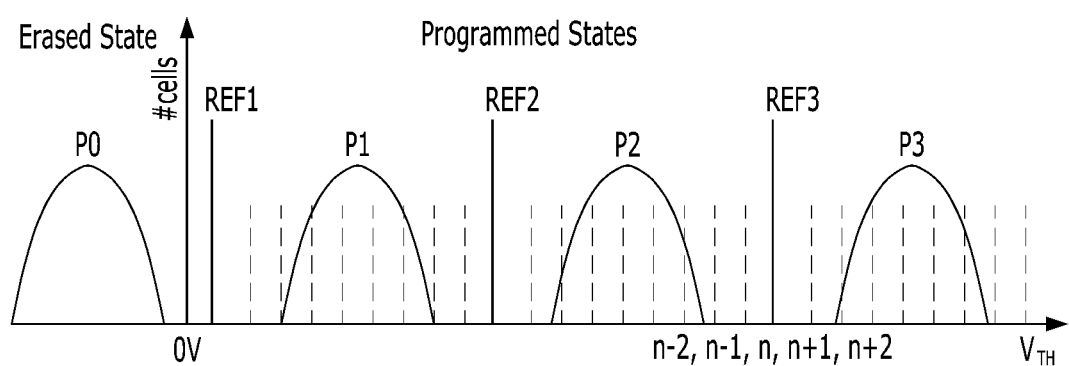
FIG. 7 illustrates target levels corresponding to plural program pulses according to an embodiment of the present disclosure.

FIG. 7 illustrates target levels corresponding to plural program pulses according to an embodiment of the present disclosure. FIG. 7 shows a program state of a non-volatile memory cell storing 2-bit data and target levels according to program pulses.

Referring to FIG. 7, the non-volatile memory cell can have an erased state P0 and three programmed states P1 to P3. For example, the memory device 150 can apply a second reference voltage REF2 to the non-volatile memory cell to distinguish the erase state P0 and the first programmed state P1 from the second and third programmed states P2, P3. In the memory device 150, a first reference voltage REF1 can be used to distinguish the erased state P0 from the first programmed state P1. The memory device 150 may use a third reference voltage REF3 to distinguish the second and third programmed states P2, P3 from each other. For example, the erased state P0 can represent 2-bit data of '11', the first programmed state P1 can represent 2-bit data of '10', the second programmed states P2 can be represent 2-bit data of '00', and the third programmed state P3 can be represent 2-bit data of '01.' According to an embodiment, the number of bits of data that can be stored in the non-volatile memory cell may vary. Further, a quantity of reference voltages or reference voltage levels for discriminating multi-bit data may vary.

A plurality of program pulses may be applied in a process of programming the non-volatile memory cell from the erased state P0 to one of the first to third programmed states P1 to P3. When a program pulse is applied to a specific memory cell, a threshold voltage of the corresponding memory cell can be gradually increased. For example, in order to increase the threshold voltage of a specific non-volatile memory cell from the second programmed state P2 to the third programmed state P3, plural programming pulses may be applied in stages. For example, in FIG. 7, by applying eight programming pulses or applying a program pulse eight times, the threshold voltage distribution of the non-volatile memory cells can be gradually increased from the second programmed state P2 to the third programmed state P3. The larger the number of program pulses applied to a specific memory cell for increasing a preset level of threshold voltage, the narrower a width of threshold voltage distribution.

If the threshold voltage distribution of the non-volatile memory cells can be slightly shifted to the right by an applied programming pulse of the program voltage application operation, the verification operation can be performed in response to the program voltage application operation. For example, after applying an Nth programming pulse, the memory device 150 may perform a verification operation on an N target level corresponding to the Nth programming pulse. According to an embodiment, after the Nth programming pulse is applied, a verification operation is performed on plural target levels, e.g., N, N–1, N–2 target levels, which correspond to the Nth, (N–1)th, and (N–2)th programming pulses individually. If a verification operation is performed for several target levels after applying a single programming pulse, the memory device 150 may more accurately determine the threshold voltage distribution of the plurality of non-volatile memory cells. Based on the verification, the memory device 150 can narrow widths of threshold voltage distributions, each corresponding to one of the first to third programmed states P1 to P3. Further, the memory device 150 can more accurately determine a degree of wear or a result of operation.

When a plurality of programming pulses is applied while data is stored in a plurality of non-volatile memory cells included in the memory group 330, the control circuit 180 described with reference to FIG. 1 can include information about target levels verified in response to each programming pulse. In addition, according to a result of the verification operation performed in response to each programming pulse, the control circuit 180 may include information regarding which level or how long a next programming pulse applied to the plurality of non-volatile memory cells has or is. According to an embodiment, such information may be stored in a form of a look-up table.

Figure 8:
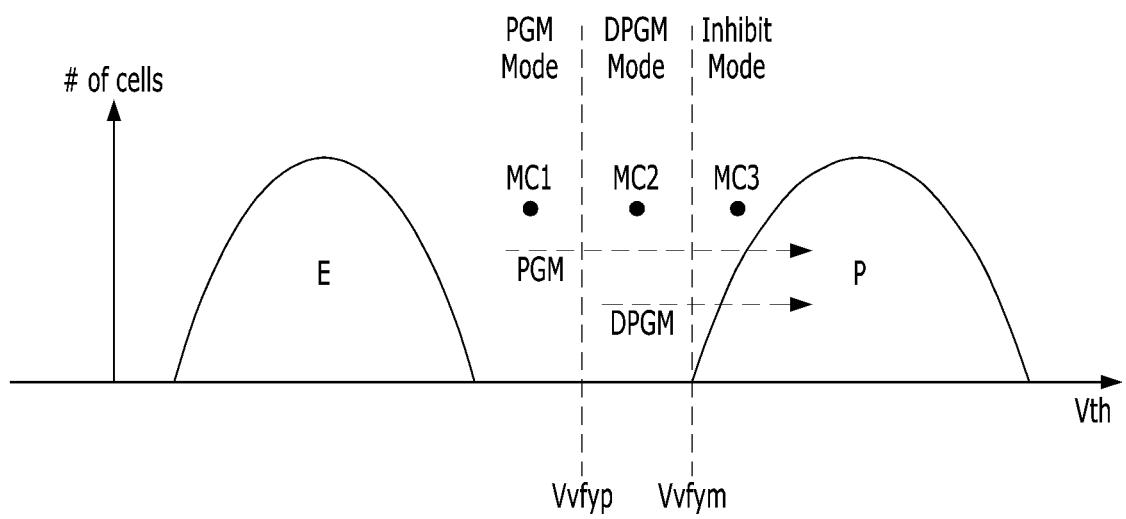
FIG. 8 illustrates a program operation according to an embodiment of the present disclosure.

FIG. 8 illustrates a program operation in the memory device 150 according to an embodiment of the present disclosure. In FIG. 8, a non-volatile memory cell of the memory device 150 can store single-bit (1-bit) data, and the memory device 150 may be controlled such that a threshold voltage of the non-volatile memory cell becomes in one of an erase state E or a program state P. When the incremental step pulse programming (ISPP) operation is performed as described with reference to FIG. 6, the threshold voltage of the non-volatile memory cell may be changed from the erase state E to the program state P. Also, it is noted that, in FIG. 6, the verification operation may be performed after a program pulse is applied.

Referring to FIG. 8, the verification operation may can use two verification voltages Vvfp, Vvfym. For example, a data program operation supporting a double verify program (DPGM) operation may perform a verification operation with two different levels of verification voltage during a verification operation. Through the verification operation using two different verification voltage levels, the degree to which the non-volatile memory cell is programmed in response to a next program pulse may be adjusted. For example, the memory device 150 can determine the amount of change in the threshold voltage that could be caused by a following program pulse.

According to an embodiment, the verification voltage may include a pre-verification voltage Vvfyp and a main verification voltage Vvfym. The main verification voltage Vvfym may be a verification voltage corresponding to a target state of the data program operation. The pre-verification voltage Vvfyp may have a level lower than the main verification voltage Vvfym. In the verification operation, the pre-verification voltage Vvfyp can be used for checking the degree to which the data program operation is performed on a non-volatile memory cell. When it is checked by the verification operation using the main verification voltage Vvfym, that a threshold voltage of the non-volatile memory cell is changed with the program state P, the non-volatile memory cell does not need to be further programmed by a following program pulse. Also, when the threshold voltage of the non-volatile memory cell is lower than the pre-verification voltage Vvfyp, the non-volatile memory cell may be programmed by the following program pulse.

If the threshold voltage of the non-volatile memory cell is in a range between the pre-verification voltage Vvfyp and the main verification voltage Vvfym, the non-volatile memory cell could be programmed too much when normally programmed by the following program pulse, e.g., the threshold voltage of the non-volatile memory cell may shift rightward too much in which case overprogramming may occur. Thus, the memory device 150 could reduce the amount of change in the threshold voltage. In this case, the memory device 150 may control or adjust the degree to which the non-volatile memory cell is programmed, e.g., the amount of change in the threshold voltage, while the following program pulse is applied. Accordingly, the memory device 150 can control a potential of the bit line while a program operation is performed. Referring to lengths of arrows shown in FIG. 8, the amount of change in the threshold voltage caused by a first mode (PGM) is different from that caused by a second mode (DPGM)

Also, in FIG. 8, when a plurality of non-volatile memory cells is programmed by a program pulse and then a verification operation is performed using the pre-verification voltage Vvfyp and the main verification voltage Vvfym, the plurality of non-volatile memory cells can be in three different states MC1, MC2, MC3. For a non-volatile memory cell having a first state MC1 lower than the pre-verification voltage Vvfyp, the memory device 150 may apply a next program pulse to induce a change of threshold voltage of the corresponding memory cell by an amount or shift corresponding to the corresponding program pulse. Such a general program mode (PGM Mode) may be referred to as a first program mode.

On the other hand, if a non-volatile memory cell has a third state MC3 higher than the main verification voltage Vvfym, the memory device 150 may avoid or inhibit further programming the corresponding memory cell by the following program pulse because the threshold voltage of the non-volatile memory cell has already reached the program state P. In one embodiment, inhibiting a non-volatile memory cell from being additionally programmed may be referred to as a program inhibit mode.

When the non-volatile memory cell is in a second state MC2, the threshold voltage of the non-volatile memory cell may shift too much when the corresponding non-volatile memory cell is programmed in the first program mode (PGM mode). Thus, in the second program mode (DPGM mode) when the following program pulse is applied, the amount of change of the threshold voltage may be smaller than that caused in the first program mode (PGM mode).

The degree to which the non-volatile memory cell is programmed, e.g., an amount of change in threshold voltage, may be determined based on the time for which the program pulse is applied, the number of times the program pulse is applied, and/or the potential difference between the program pulses. Although a program pulse applied to plural non-volatile memory cells connected to a single word line may be the same in some embodiments, the memory device 150 can change or adjust a threshold voltage change amount of each non-volatile memory cell. To increase threshold voltages of the plural non-volatile memory cells by different amounts, the memory device 150 can change or adjust potentials of bit lines connected to the plural non-volatile memory cells.

For example, during a period in which a program pulse is applied to the word line, a reference, e.g., ground voltage, may be applied to a bit line connected to a first memory cell of which threshold voltage is in the first state MC1, but the potential of another bit line connected to a second memory cell having a threshold voltage in the second state MC2, could be higher than the reference, e.g., ground voltage. Because the potential difference between a word line and a bit line connected to a non-volatile memory cell is less, the change amount of the threshold voltage caused by the program pulse may be smaller.

When the potential difference between the word line and the bit line is lower than a preset level, the non-volatile memory cell would not be programmed. Because the potential difference of the second memory cell having the second state MC2 is smaller than that of the first memory cell having the first state MC1, the degree to which the second memory cell is programmed by the following program pulse can be less than that of the first memory cell.

Further, even when the following program pulse is applied to a third memory cell having the third state MC3, a program inhibit voltage can be applied to a bit line coupled to the third memory cell. Because the potential difference between the program pulse and the program inhibit voltage applied to the third memory cell having the third state MC3 is lower than the preset level, the third memory cell having the third state MC3 might not be further programmed by the following program pulse.

The program mode may be determined according to the verification result corresponding to a program operation performed on the non-volatile memory cell. The program mode may include the first program mode (PGM Mode), the second program mode (DPGM Mode), and the third program mode (PGM Inhibit Mode). For example, a verify pass may indicate that a non-volatile memory cell is read as an off cell in response to a verification voltage. A verify fail may indicate that the non-volatile memory cell is read as an on cell in response to the verification voltage. For example, if the threshold voltage of the non-volatile memory cell is lower than the verification voltage located to the left, the non-volatile memory cell may be read as an on cell. But, if the threshold voltage is equal to, or higher than, the verification voltage located to the right, the non-volatile memory cell may be read as an off cell.

Referring to FIG. 8, a non-volatile memory cell in which the program mode is the first program mode (PGM Mode) may be read as an on cell by both the pre verify voltage Vvfyp and the main verify voltage Vvfym. Another non-volatile memory cell in which the program mode is the second program mode (DPGM Mode) may be read as an off cell by the pre-verification voltage Vvfyp and read as an on-cell by the main verify voltage Vvfym. Another non-volatile memory cell in which the program mode is the third program mode (PGM Inhibit Mode) may be read as an off cell by both the pre verify voltage Vvfyp and the main verify voltage Vvfym. Moreover, because the pre-verification voltage Vvfyp has a smaller level than that of the main verification voltage Vvfym, there may be no case when a non-volatile memory cell is read as an on cell by the pre-verification voltage Vvfyp and read as an off cell by the main verification voltage Vvfym.

Figure 9:
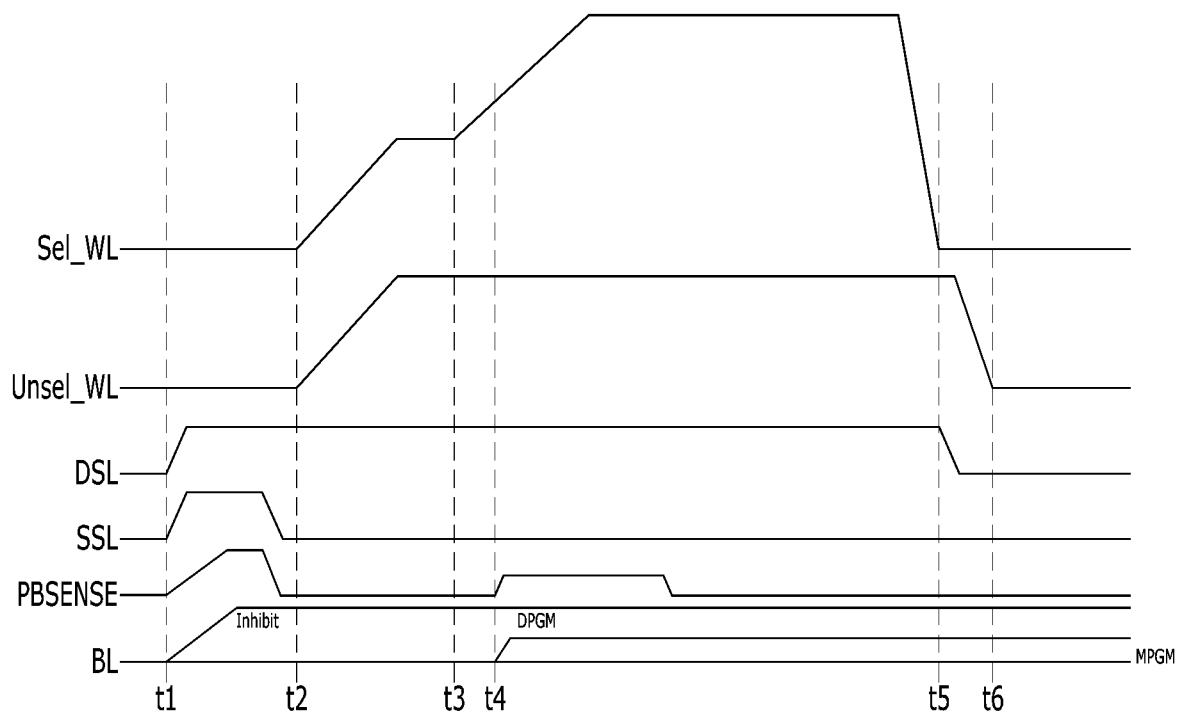
FIG. 9 illustrates another Incremental Step Pulse Programming (ISPP) operation according to an embodiment of the present disclosure.

FIG. 9 illustrates a program operation that may vary according to discharge of a string and a bit line according to an embodiment of the present disclosure. For example, FIG. 9 illustrates discharge of the channel of the string 340 through a first transistor operated by a first control voltage applied through a drain select line DSL before or while a program pulse is applied during a data program operation.

Referring to FIG. 9, when a program pulse is applied to the selected word line Sel_WL, a pass voltage may be applied to the unselected word line Unsel_WL. Before the program pulse is applied, the first control voltage and the second control voltage may be applied to the drain select line DSL and the string select line SSL, individually. Thereafter, when a page buffer control signal PBSENSE is activated, the potential of each bit line BL may be maintained differently.

As described with reference to FIG. 8, the page buffer control signal PBSENSE may be activated in response to one of three program modes. For example, when a program mode regarding a non-volatile memory cell is the first program mode (PGM mode, general PGM mode, MPGM), a bit line connected the non-volatile memory cell is maintained at the reference, e.g., ground voltage. When the program mode is the third mode (PGM Inhibit mode), the potential of the bit line can be increased by a program inhibit voltage. When the program mode of the non-volatile memory cell is the second mode (DPGM), the potential of the bit line may be increased with a time difference. In order to reduce the degree to which data is programmed in the nonvolatile memory cell, the potential of the bit line is changed while the program pulse is applied. After the program pulse is applied, the second control voltage applied through the string selection line SSL may be deactivated.

Specifically, a program operation can start at a first time point t1. When the drain select line DSL and the source select line SSL are activated, charges can flow through both ends of the string 340. When the page buffer signal PBSENSE is activated, a potential of the bit line BL coupled to the non-volatile memory cell for the program inhibit mode can rise. Moreover, a bit line BL coupled to the non-volatile memory cell for the first program mode (PGM mode) or the second program mode (DPGM mode) can be maintained in a ground voltage state.

At a second time point t2, a program voltage may be applied to the selected word line Sel_WL and a pass voltage may be applied to an unselected word line Unsel_WL.

At a third time point t3, a potential of the program voltage may increase, and a threshold voltage of the non-volatile memory cell coupled to the selected word line Sel_WL can increase. When a potential of the bit line BL coupled to the non-volatile memory cell corresponding to the program inhibit mode is maintained in a high level, the threshold voltage of the corresponding non-volatile memory cell might not be changed.

At a fourth time point t4, the page buffer control signal PBSENSE may be adjusted to distinguish the first program mode (PGM Mode) and the second program mode (DPGM Mode) from each other. The level of the page buffer control signal PBSENSE may be lowered to halfway turn on a transistor for coupling the bit line BL or the page buffer to the non-volatile memory cell in which the second program mode DPGM mode is performed. Previously, the page buffer control signal PBSENSE applied between the first time point t1 and the second time point t2 is for fully turning on the transistor, whereas a lower level of the page buffer control signal PBSENSE is applied to the transistor at the fourth time point t4. The transistor turned on or off by the page buffer control signal PBSENSE may function as an element having a resistance according to the level of the page buffer control signal PBSENSE. According to an embodiment, a value stored in a latch of the page buffer can be changed from '0' to '1' at the fourth time point t4. Even when a value of "1" is stored in the latch of the page buffer, a potential of the bit line can be maintained at a lower level than a preset level corresponding to the value of "1". Through this procedure, the memory device 150 may perform the second program mode (DPGM Mode) differently from the first program mode (PGM Mode) or the program inhibit mode (Inhibit Mode). Control in the second program mode (DPGM Mode) would be described later with reference to FIG. 11. Here, performing the first and second program modes PGM mode and DPGM mode can include performing or running a program operation in the first and second program modes PGM mode and DPGM mode, respectively.

When the program operation is performed during a preset time, the memory device 150 may no longer apply the program voltage to the selected word line Sel_WL at the fifth time point t5. Thereafter, at a sixth time point t6, the memory device 150 may no longer apply the pass voltage to the unselected word line Unsel_WL.

Figure 10:
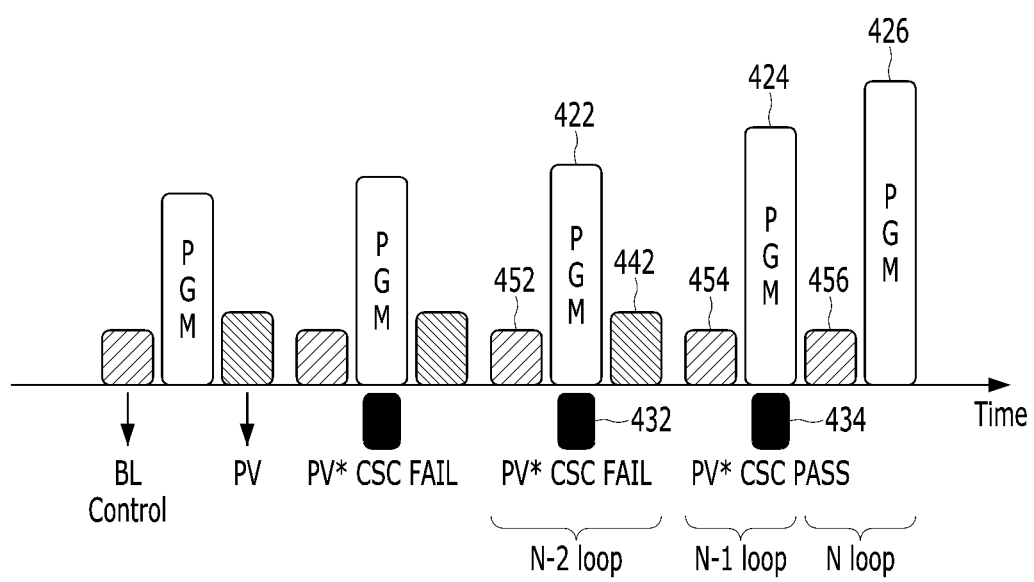
FIG. 10 illustrates a relationship between a result of a current sensing circuit (CSC) in a memory device and a threshold voltage distribution according to an embodiment of the present disclosure.

FIG. 10 illustrates a relationship between a result of a current sensing circuit (CSC) in a memory device and a threshold voltage distribution.

Referring to FIG. 10, the memory device 150 can program data through an ISPP operation and use a current sensing circuit (CSC) to perform check operations 432, 434 in at least some of plural program loops included in the ISPP operation. The check operations 432, 434 can be performed for checking a threshold voltage distribution of the plurality of non-volatile memory cells.

Specifically, in FIG. 10, the ISPP operation includes N program loops where N is a natural number. The number of program loops performed by the memory device 150 can be varied according to data stored in a non-volatile memory cell or characteristics of the non-volatile memory cell.

Each program loop can include a unit program operation (PGM) for applying a program pulse to a non-volatile memory cell for programming data and a verification operation (program verification, PV) corresponding to the unit program operation. Referring to FIG. 8, a bit line coupled to the non-volatile memory cell can be controlled before or during a program operation (PGM) (BL Control). For example, referring to FIG. 6, a threshold voltage of the non-volatile memory cell capable of storing 2-bit data may be changed from an erased state P0 to a third program state P3. The memory device 150 may monitor or track a change to the threshold voltage while repeatedly performing a program loop including a unit program operation and a verification operation.

As a threshold voltage distribution regarding the non-volatile memory cells having each program state becomes narrower, safety of data stored in the non-volatile memory cell may be improved or enhanced.

According to an embodiment, when a program degree increased through a specific program loop performed by the memory device 150 is far different from a target program state of the non-volatile memory cell, the verification operation after the unit program operation could not be performed. On the other hand, when one of the three program states P1 to P3 is a target program state of a non-volatile memory cell and the program degree is expected to reach to the target program state, a verification operation to the non-volatile memory cell can be performed. The verification operation can be performed on other non-volatile memory cells coupled to the same word line as the non-volatile memory cell.

When a threshold voltage of the non-volatile memory cell approaches a target program value (N−2 loop, N−1 loop, N loop), the memory device 150 can use a current sensing circuit (CSC) to perform the check operation. The program value can indicate threshold voltage level between neighboring program states (See FIG. 7). In the check operation, the memory device 150 can establish a comparison voltage that has a lower level than a preset level corresponding to a program state or a program value which is a target of the program operation. For example, the comparison voltage might correspond to one of target program values in previous program loops performed on the non-volatile memory cell. The memory device 150 can count a number of non-volatile memory cells having a threshold voltage lower than the comparison voltage. Thereafter, the memory device 150 may compare a counted number with a reference to output either a pass signal PASS or a failure signal FAIL as a result of the check operation.

According to an embodiment, the memory device 150 may perform the program operation 422 and the bit line control 452. Then, the memory device 150 may perform the check operation 432. When a result of the check operation is the failure signal FAIL (N−2 loop), the memory device 150 can perform the verification operation 442 corresponding to the program operation 422. The memory device 150 can apply verification voltages corresponding to plural program values to the plural non-volatile memory cells during the verification operation. For example, as shown in FIG. 6, when a plurality of program pulses are sequentially applied to a non-volatile memory cell several times (e.g., n+2, n+1, n, n−1, or n−2 loop), the memory device 150 can recognize or estimate which non-volatile memory cell has a threshold voltage corresponding to a program value which is a target of the plurality of program pulses. Referring to FIG. 8, in response to a result of the verification operation, the memory device 150 can determine which mode is performed on a non-volatile memory cell among a first program mode (PGM mode), a second program mode (DPGM mode), and a program inhibit mode (Inhibit).

According to an embodiment, when the result of the check operation is the pass signal PASS (N−1 loop), the memory device 150 might not perform the verification operation on the non-volatile memory cell. After performing the program operation 424 together with the bit line control 454, the memory device can determine whether a threshold voltage distribution in a specific program loop (N−1 loop) satisfies a reference (PV*CSC PASS) through the check operation 434. When the threshold voltage distribution is satisfied, the memory device 150 might not perform a verification operation corresponding to the program operation 424, and then can perform a next program loop (N loop).

When a result of the check operation in a specific program loop (N−1 loop) is the pass signal (PV*CSC PASS), the memory device 150 can perform a second program mode (DPGM) or a third program mode (Program Inhibit) on non-volatile memory cells as the program operation 426 during the next program loop (N loop). In this loop (N loop), the memory device 150 might not perform the first program mode (PGM mode) on the non-volatile memory cells. In addition, after the program operation 426 performed with the second program mode (DPGM) and the program inhibit mode of the next program loop (N loop) is performed, a verification operation corresponding to the program operation 426 might be skipped (not performed).

As a result, when the result of the check operation is the pass signal (PV*CSC PASS), the memory device 150 can skip a verification twice. For example, two verification operations corresponding to two program operations 424, 426 could be skipped. Through this procedure, the memory device 150 can reduce a time spent on the ISPP operation. Hereinafter, it is described how the memory device 150 differently performs a program operation when the result of the check operation 432 is the failure signal (PV*CSC FAIL) and when the result of the check operation 434 is the pass signal (PV*CSC PASS).

Figure 11:
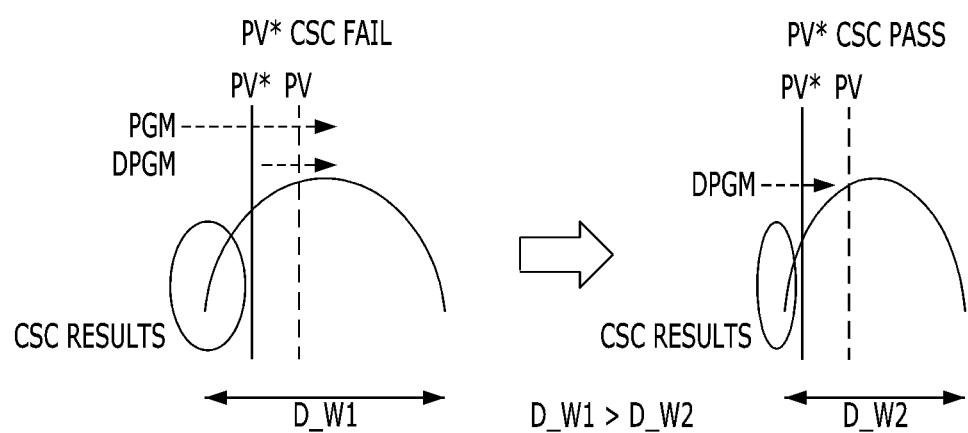
FIG. 11 illustrates a memory device that performs a program operation according to an embodiment of the present disclosure.

FIG. 11 illustrates a memory device that performs a program operation according to an embodiment of the present disclosure.

Referring to FIG. 11, after performing a program operation corresponding to a specific program value PV, a threshold voltage distribution regarding a plurality of non-volatile memory cells can have a Gaussian distribution. A width D_W1 of the threshold voltage distribution can be different according to characteristics of the plurality of non-volatile memory cells. For the check operation, the memory device 150 can apply a comparison voltage PV* which has a smaller level than a specific program value PV to the plurality of non-volatile memory cells.

Referring to a case where the result of the check operation is a failure signal (PV*CSC FAIL), the number of non-volatile memory cells having a lower threshold voltage than the comparison voltage (PV*) in the threshold voltage distribution of plural non-volatile memory cells could be greater than a first reference. In this case, the memory device 150 may perform a verification operation. According to a result of the verification operation, the memory device 150 can perform a first program mode (PGM mode) in a next loop on some of the plural non-volatile memory cells having a lower threshold voltage than the comparison voltage PV* to induce a greater change amount of the threshold voltage of the corresponding non-volatile memory cells. Further, the memory 150 can perform a second program mode (DPGM) in the next loop on others of the plural non-volatile memory cells having a greater threshold voltage than the comparison voltage PV* but a lower threshold voltage than the program value PV to induce a lesser change amount of the threshold voltage of the corresponding non-volatile memory cells. The memory device 150 may determine which mode between the first program mode (PGM mode) and the second program mode (DPGM) would be performed in the next loop on each of the plural nonvolatile memory cells based on the result of the verification operation. Furthermore, the memory device 150 can perform a program inhibit mode in the next loop on a non-volatile memory cell having a greater threshold voltage than a specific program value PV based on the result of the verification operation.

After at least one program operation is performed in the memory device 150, a result of the check operation can be a pass signal (PV*CSC PASS). In a case where the result of the check operation is the pass signal (PV*CSC PASS), the number of non-volatile memory cells having a lower threshold voltage than the comparison voltage PV* in the threshold voltage distribution of the plural non-volatile memory cells can be less than a second reference. The second reference might be the same with, or different from, the first reference. In this case, the memory device 150 can determine that the verification operation might not be required. Further, the memory device 150 can determine that a deviation of the threshold voltage distribution of the plural non-volatile memory cells becomes smaller with respect to the specific program value PV. That is, a width (D_W2) of the threshold voltage distribution when the result of the check operation is the pass signal (PV*CSC PASS) could be narrower than a width (D_W1) of the threshold voltage distribution when the result of the check operation is the failure signal (PV*CSC FAIL). According to an embodiment, when the memory device 150 performs the second program mode DPGM on a non-volatile memory cell having a lower threshold voltage than the comparison voltage PV*, the width of the threshold voltage distribution of the plural non-volatile memory cells can become smaller. Also, through the second program mode DPGM, the memory device 150 may determine that data corresponding to a specific program value PV is stored in the plural non-volatile memory cells. Accordingly, the memory device 150 may skip the verification operation for the plural non-volatile memory cells based on the result of the check operation.

Moreover, the memory device 150 can establish a comparison voltage PV* for a check operation. According to an embodiment, the comparison voltage PV* can be set based on a program value. For example, the memory device 150 sets the comparison voltage PV* having a level in a range between the program value PV and a preset level obtained by subtracting from the program value PV an amount of change in the threshold voltage of the non-volatile memory cell caused by the second program mode DPGM. In another example, the memory device 150 can determine the comparison voltage PV* in a range between the program value PV_n and a previous loop program value PV_n−1 followed by the program value PV_n. Referring to FIG. 1, for the ISPP operation, the control device 180 in the memory device 150 can store both program values PV for applying a program pulse in each program loop and comparison voltages PV* used for the check operation in a register or a table.

Figure 12:
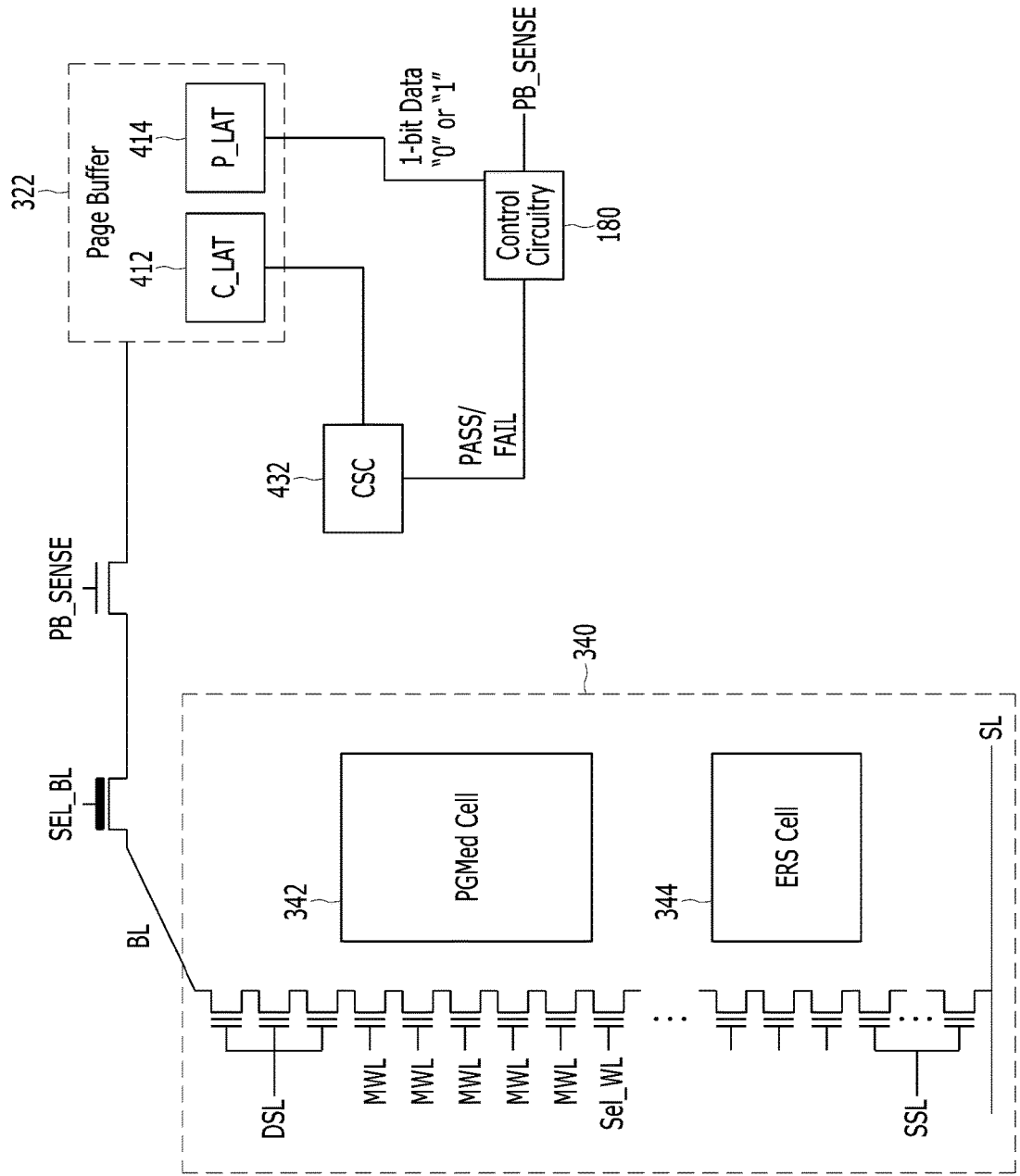
FIG. 12 illustrates an example of the current sensing circuit (CSC) according to an embodiment of the present disclosure.

FIG. 12 illustrates an example of the current sensing circuit (CSC) according to an embodiment of the present disclosure.

Referring to FIG. 12, the memory device 150 can include a string 340 including a plurality of non-volatile memory cells. The string 340 can include a first transistor, connected to a bit line BL, for operating in response to a first control voltage app lied through the drain select line DSL, a second transistor, connected to a source line SL, for operating in response to a second control voltage applied through a string select line SSL, and at least one non-volatile memory cell connected between the first and second transistors. The at least one non-volatile memory cell can be programmed by a program pulse applied through a word line. The source line SL shown in FIG. 12 may correspond to the common source line CSL described with reference to FIG. 1, the first transistor may correspond to the drain select transistor DST, and the second transistor may correspond to the string select transistor SST. According to an embodiment, the first transistor and/or the second transistor may be individually implemented as a plurality of transistors connected in series with each other.

As a storage space of the memory device 150 increases, the number of non-volatile memory cells serially connected between the first transistor and the second transistor may increase. Referring to FIG. 12, multi-bit data can be sequentially programmed in a preset order (PGM Order) from a non-volatile memory cell connected to the first transistor to another non-volatile memory cell connected to the second transistor. The plurality of non-volatile memory cells included in the string 340 can be divided into a programmed non-volatile memory cell 342 having a programmed state (P1, P2, P3, see FIG. 7) and an erased non-volatile memory cell 344 in which data is erased to maintain an erased state (P0, see FIG. 7). When a next program operation is performed, a program pulse may be applied to a selected word line Sel_WL connected to the non-volatile memory cell located next to the programmed nonvolatile memory cell 342. When a program pulse is applied to the selected word line Sel_WL, plural memory cells coupled to the selected word line Sel_WL could be selectively programmed (e.g., in response to a potential of the bit line).

The string 340 can be coupled to the page buffer 322 through the bit line BL. Connections of the bit line BL and the page buffer 322 can be controlled by the bit line selection signal SEL_BL and the page buffer signal PB_SENSE. The page buffer 322 can include a plurality of latches. The plurality of latches can include a program latch (P_LAT, 414) capable of storing different or changed values according to a program mode, a check latch (C_LAT, 412) capable of storing data output from the string 340, and the like. According to an embodiment, the program latch 414 may be used differently according to an operation performed on the string 340. When a read operation is performed, data is transferred from the string 340 through the bit line BL and can be stored in the page buffer 322. The plurality of latches can be used to temporarily store data before the data is output. When a program operation is performed, data stored in a plurality of latches may be used to control a potential of the bit line BL coupled to the string 340. Also, the number of latches can be different according to the number of bits of data stored in the non-volatile memory cell. Because each latch can store 1-bit data, four latches in the page buffer 322 connected to the string 340 including a non-volatile memory cell capable of storing 4-bit data can be used for a read operation or a program operation. According to an embodiment, the page buffer 322 may include a plurality of latches separately divided for data input/output operations.

The ISPP operation can include a program operation, a check operation, and a verification operation. Some of the plurality of latches in the page buffer 322 can be used as latches for a check operation and a verification operation to store data transferred from the string 340 like a read operation, and others of the plurality of latches are used for controlling a potential of a bit line BL for a program operation. Further, the page buffer 322 can further include at least one switching element for selectively connecting latch(es) to the bit line BL.

In the check operations 432, 434 described in FIG. 10, the number of non-volatile memory cells can be determined based on a comparison with a single comparison voltage PV* (see FIG. 11). But, in the verification operation 442 described in FIG. 10, the number of non-volatile memory cells might be determined based on comparisons with plural comparison voltages for verifying plural programmed states (e.g., REF1 to REF3 shown in FIG. 7). Referring to FIG. 11, the check operations 432, 434 might be used for determining whether to finally perform the second program mode DPGM on at least one non-volatile memory cell. However, the verification operation 442 might be used for determining whether to perform the first program mode (PGM) and/or the second program mode (DPGM) for plural program states programmed in plural non-volatile memory cells.

According to an embodiment, the page buffer 322 can be coupled to a current sensing circuit (CSC) 432. The current sensing circuit CSC 432 can be coupled to a check latch C_LAT 412 capable of storing a value transferred from a non-volatile memory cell during the check operation corresponding to a single target level. Unlike the checking operation, when the verification operation based on a plurality of program levels P0 to P4 is performed, values corresponding to each program level P0, P1, P2, P3 can be stored in a plurality of check latches 412 in the page buffer 322. Referring to FIG. 12, the current sensing circuit CSC 432 can determine a value transferred from the non-volatile memory cell based on the comparison voltages PV*, PV. The current sensing circuit 432 might be connected to the plurality of strings 340 and could compare values transferred from the plurality of non-volatile memory cells connected to the selected word line Sel_WL with the comparison voltages PV*, PV. The number of non-volatile memory cells having a lower threshold voltage than the comparison voltages PV*, PV could be counted. The current sensing circuit (CSC) 432 can output the pass signal PASS to the control circuit 180, when the number of non-volatile memory cells having a lower threshold voltage than the comparison voltages PV*, PV is less than a reference. Otherwise, the failure signal FAIL may be output to the control circuit 180.

FIG. 13 illustrates a method of operating a memory device according to an embodiment of the present disclosure.

Referring to FIG. 13, the method for operating a memory device can include starting a program operation (operation 710), controlling a potential of a bit line and applying a program pulse for the program operation (operation 712), and performing a check operation through the current sensing circuit CSC after applying the program pulse (operation 714).

When a result of the check operation does not pass (NO in operation 714), the method for operating the memory device may include verifying the program operation (operation 718) and determining whether the program operation is terminated according to a verification result (operation 720). Because the check operation is not passed (NO in operation 714), the memory device can estimate that an additional program pulse should be applied to at least some of the plurality of non-volatile memory cells. In the operation 720, the memory device can determine whether to perform the first program mode (PGM) or the second program mode (DPGM) on the plurality of non-volatile memory cells based on the verification result. Thereafter, the memory device 150 may perform an operation 712 of controlling the bit line and applying a program pulse to perform a next program loop (Loop Increment).

When the check operation is passed (YES in operation 714), the memory device 150 can perform the second program mode (DPGM) for at least some non-volatile memory cells as a next program loop (operation 716). After performing the second program mode DPGM (operation 716), the memory device 150 may terminate the program operation (operation 722).

When the check operation is passed (YES in operation 714), the memory device 150 might not perform the operation 718 for verifying a result corresponding to the operations 712 of applying program pulses. Further, the memory device 150 might not perform another verification operation corresponding to the second program mode DPGM (operation 716) performed as the next program loop. Through this procedure, an operational margin or time spent on the program operation could be reduced. The burden due to the verification operation performed on the plurality of non-volatile memory cells can be reduced.

A memory device according to an embodiment of the present disclosure can improve a data input/output speed.

In addition, according to an embodiment of the present disclosure, data safety of the memory device can be improved, and a wear degree of the memory device can be reduced.

The methods, processes, and/or operations described herein may be performed by code or instructions to be executed by a computer, processor, controller, or other signal processing device. The computer, processor, controller, or other signal processing device may be those described herein or one in addition to the elements described herein. Because the algorithms that form the basis of the methods (or operations of the computer, processor, controller, or other signal processing device) are described in detail, the code or instructions for implementing the operations of the method embodiments may transform the computer, processor, controller, or other signal processing device into a special-purpose processor for performing the methods herein.

Also, another embodiment may include a computer-readable medium, e.g., a non-transitory computer-readable medium, for storing the code or instructions described above. The computer-readable medium may be a volatile or non-volatile memory or other storage device, which may be removably or fixedly coupled to the computer, processor, controller, or other signal processing device which is to execute the code or instructions for performing the method embodiments or operations of the apparatus embodiments herein.

The controllers, processors, control circuitry, devices, modules, units, multiplexers, generators, logic, interfaces, decoders, drivers, generators and other signal generating and signal processing features of the embodiments disclosed herein may be implemented, for example, in non-transitory logic that may include hardware, software, or both. When implemented at least partially in hardware, the controllers, processors, control circuitry, devices, modules, units, multiplexers, generators, logic, interfaces, decoders, drivers, generators and other signal generating and signal processing features may be, for example, any of a variety of integrated circuits including but not limited to an application-specific integrated circuit, a field-programmable gate array, a combination of logic gates, a system-on-chip, a microprocessor, or another type of processing or control circuit.

When implemented at least partially in software, the controllers, processors, control circuitry, devices, modules, units, multiplexers, generators, logic, interfaces, decoders, drivers, generators and other signal generating and signal processing features may include, for example, a memory or other storage device for storing code or instructions to be executed, for example, by a computer, processor, microprocessor, controller, or other signal processing device. The computer, processor, microprocessor, controller, or other signal processing device may be those described herein or one in addition to the elements described herein. Because the algorithms that form the basis of the methods (or operations of the computer, processor, microprocessor, controller, or other signal processing device) are described in detail, the code or instructions for implementing the operations of the method embodiments may transform the computer, processor, controller, or other signal processing device into a special-purpose processor for performing the methods described herein.

While the present teachings have been illustrated and described with respect to the specific embodiments, it will be apparent to those skilled in the art in light of the present disclosure that various changes and modifications may be made without departing from the spirit and scope of the disclosure as defined in the following claims. Furthermore, the embodiments may be combined to form additional embodiments.

What is claimed is:

1. A memory device, comprising:
   a cell group including plural non-volatile memory cells capable of storing data; and
   a control circuit configured to perform a program operation for programming data in the plural non-volatile memory cells through a plurality of program loops, each program loop including a unit program operation for applying a program pulse to the plural non-volatile memory cells and a verification operation for verifying a result of the unit program operation, use a current detection circuit for detecting whether a threshold voltage distribution of the plural non-volatile memory cells satisfies a reference in a specific program loop of the plurality of program loops, and terminate the program operation after applying a preset program pulse to the plural non-volatile memory cells in a next program loop following the specific program loop.

2. The memory device according to claim 1, wherein the control circuit is configured to perform a check operation for recognizing the threshold voltage distribution at a time between the unit program operation and the verification operation in some of the plurality of program loops.

3. The memory device according to claim 2, wherein the check operation includes establishing a comparison voltage which has a lower level than a preset level corresponding to a program value which is a target of the program operation, counting a number of non-volatile memory cells having a threshold voltage having a lower level than the comparison voltage, and comparing a counted number with the reference.

4. The memory device according to claim 3, wherein the comparison voltage has a level which is within either a first range between the preset level and a level corresponding to another program value which is the closest lower than the preset level or a second range between the preset level and a level obtained by subtracting a degree of threshold voltage, which is changed through a second program mode, from the preset level.

5. The memory device according to claim 2, wherein the verification operation checks the threshold voltage distribution of the plural non-volatile memory cells regarding plural program values corresponding to the program operation.

6. The memory device according to claim 1,
wherein the unit program operation is performed in a mode selected among a first mode, a second mode, and a third mode,
wherein, the first mode is to apply the second program pulse to change or adjust a threshold voltage of the at least one non-volatile memory cell by a first level which is equal to or larger than a changed level of the threshold voltage, which is caused by the first program pulse,
wherein the second mode is to apply the second program pulse to change or adjust the threshold voltage of the at least one non-volatile memory cell by a second level which is smaller than the changed level caused by the first program pulse, and
wherein the third mode is to apply the second program pulse to the at least one non-volatile memory cell of which a change of the threshold voltage is inhibited.

7. The memory device according to claim 6, wherein the control circuit is configured to change values stored in latches, included in page buffers coupled to bit lines coupled to the plural non-volatile memory cells, in response to the mode selected among the first mode, the second mode, and the third mode.

8. The memory device according to claim 7, wherein the control circuit stores a value of '0' in a first latch for the unit program operation performed in the first mode, stores the value of '0' in a second latch and changes the value of '0' into a value of '1' in the second latch at a timing of turning a transistor coupling the bit line and the page buffer on halfway for the unit program operation performed in the second mode, and stores the value of '1' in a third latch for the unit program operation performed in the third mode.

9. The memory device according to claim 1, wherein the control circuit skips the verification operation of the specific program loop when the threshold voltage distribution satisfies the reference and performs the next program loop with either a second mode or a third mode.

10. The memory device according to claim 1, wherein the control circuit applies verification voltages to the plural non-volatile memory cells to check whether data is programmed in the plural non-volatile memory cells, the verification voltages corresponding to plural program values which are targets of the program operation.

11. The memory device according to claim 1, wherein the control circuit determines a first mode, a second mode, or a third mode performed in the next program loop in response to a result of the verification operation.

12. A memory system, comprising:
a memory device configured to perform a program operation for programming data in plural non-volatile memory cells through a plurality of program loops, each program loop including a unit program operation for applying a program pulse to the plural non-volatile memory cells and a verification operation for verifying a result of the unit program operation, use a current detection circuit for detecting whether a threshold voltage distribution of the plural non-volatile memory cells satisfies a reference in a specific program loop of the plurality of program loops, and terminate the program operation after applying a preset program pulse to the plural non-volatile memory cells in a next program loop following the specific program loop; and a controller configured to transmit a program command and an address indicating the plural non-volatile memory cells to the memory device.

13. The memory system according to claim 12, wherein the memory device comprises at least one memory die or at least one memory plane.

14. The memory system according to claim 12, wherein the memory device is configured to perform a check operation for recognizing the threshold voltage distribution at a time between the unit program operation and the verification operation in some of the plurality of program loops.

15. The memory system according to claim 14, wherein the check operation includes establishing a comparison voltage which has a lower level than a preset level corresponding to a program value which is a target of the program operation, counting a number of non-volatile memory cells having a threshold voltage having a lower level than the comparison voltage, and comparing a counted number with the reference.

16. The memory system according to claim 12, wherein the unit program operation is performed in a mode selected among a first mode, a second mode, and a third mode, the first mode to apply the second program pulse to change or adjust a threshold voltage of the at least one non-volatile memory cell by a first level which is equal to, or larger than, a changed level of the threshold voltage, which is caused by the first program pulse; the second mode to apply the second program pulse to change or adjust the threshold voltage of the at least one non-volatile memory cell by a second level which is smaller than the changed level caused by the first program pulse; and the third mode to apply the second program pulse to the at least one non-volatile memory cell of which a change of the threshold voltage is inhibited.

17. The memory system according to claim 12, wherein the memory device skips the verification operation of the specific program loop when the threshold voltage distribution satisfies the reference and performs the next program loop with either a second mode or a third mode.

18. The memory system according to claim 12, wherein the memory device determines a first mode, a second mode, or a third mode performed in the next program loop in response to a result of the verification operation.

19. A method for operating a memory system comprising:
receiving a program command, program data, and location information in which data is to be stored;
controlling bit lines coupled to a plurality of non-volatile memory cells corresponding to the location information in response to the program data and applying a program pulse to a word line coupled to the plurality of non-volatile memory cells;
checking, through a current sensing circuit, whether a threshold voltage distribution of the plurality of non-volatile memory cells satisfies a reference; and
skipping, when the threshold voltage distribution satisfies the reference, a verification operation on the plurality of non-volatile memory cells and performing a second program mode on some of the plurality of non-volatile memory cells.

20. The method according to claim 19, further comprising:
- performing a verification operation on the plurality of non-volatile memory cells when the threshold voltage distribution does not satisfy the reference; and
- determining one of a first program mode, the second program mode, and a third program mode to be performed on the plurality of non-volatile memory cells according to a result of the verification operation.

* * * * *